US012765416B2

(12) United States Patent
Nouzu

(10) Patent No.: US 12,765,416 B2
(45) Date of Patent: Oct. 13, 2026

(54) SEMICONDUCTOR DEVICE AND METHOD OF MANUFACTURING SEMICONDUCTOR DEVICE

(71) Applicant: ROHM CO., LTD., Kyoto (JP)

(72) Inventor: Naoya Nouzu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 955 days.

(21) Appl. No.: 17/840,164

(22) Filed: Jun. 14, 2022

(65) Prior Publication Data

US 2022/0406756 A1 Dec. 22, 2022

(30) Foreign Application Priority Data

Jun. 16, 2021 (JP) ................................. 2021-100470

(51) Int. Cl.

*H10W 90/00* (2026.01)
*H10D 62/17* (2025.01)
*H10W 20/00* (2026.01)
*H10W 70/63* (2026.01)
*H10W 70/65* (2026.01)

(52) U.S. Cl.

CPC .......... *H10W 90/00* (2026.01); *H10D 62/378* (2025.01); *H10W 20/057* (2026.01); *H10W 20/089* (2026.01); *H10W 70/635* (2026.01); *H10W 70/65* (2026.01)

(58) Field of Classification Search

CPC ... H10D 62/378; H10D 64/529; H01L 21/743
See application file for complete search history.

(56) References Cited

U.S. PATENT DOCUMENTS

2009/0026572 A1* 1/2009 Dehlinger ............. H01L 21/743 257/621
2011/0115047 A1* 5/2011 Hebert ................. H10D 10/051 257/E29.174
2017/0256536 A1* 9/2017 Nishida ................ H10D 62/115
2017/0287774 A1* 10/2017 Abe .................. H01L 21/02255
2018/0151410 A1* 5/2018 Usami ................ H10D 84/0186
2020/0403072 A1* 12/2020 Otsubo ................ H10D 84/856
2021/0126089 A1* 4/2021 Cheng ................... H01L 21/743

FOREIGN PATENT DOCUMENTS

JP 2015122543 A 7/2015

OTHER PUBLICATIONS

Japanese Office Action dated Mar. 13, 2025, in the counterpart Japanese Patent Application No. 2021-100470.

* cited by examiner

*Primary Examiner* — Erik Kielin
(74) *Attorney, Agent, or Firm* — Rabin & Berdo. P.C.

(57) ABSTRACT

A semiconductor device includes: a semiconductor chip including a first main surface on one side and a second main surface on the other side; a pn junction portion extending along the first main surface and formed inside the semiconductor chip; a trench configured to penetrate the pn junction portion from the first main surface and partition an element region in the semiconductor chip; an insulating film configured to cover a side wall and a bottom wall of the trench; and an embedded electrode embedded in the trench via the insulating film, wherein the bottom wall of the trench includes a protrusion protruding from a lower end of the insulating film toward an inner upper side of the insulating film in a depth direction of the trench.

18 Claims, 21 Drawing Sheets

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2021-100470, filed on Jun. 16, 2021, the entire contents of which are incorporated herein by reference.

TECHNICAL FIELD

The present disclosure relates to a semiconductor device and a method of manufacturing a semiconductor device.

BACKGROUND

In the related art, there is known a semiconductor device including a p-type region, a first p epitaxial region, an n-type embedded region, a second p epitaxial region, and a DTI structure (deep trench isolation structure). The first p epitaxial region is formed on the p-type region. The n-type embedded region is formed on the first p epitaxial region. The second p epitaxial region is formed on the n-type embedded region. The DTI structure surrounds a formation region of a high-withstand-voltage horizontal MOS transistor in a plan view. The DTI structure penetrates the second p epitaxial region, the n-type embedded region and the first p epitaxial region so as to reach the p-type region.

SUMMARY

Some embodiments of the present disclosure provide a semiconductor device capable of achieving both improvement of manufacturing efficiency and improvement of a withstand voltage.

According to one embodiment of the present disclosure, there is provided a semiconductor device includes: a semiconductor chip including a first main surface on one side and a second main surface on the other side; a pn junction portion extending along the first main surface and formed inside the semiconductor chip; a trench configured to penetrate the pn junction portion from the first main surface and partition an element region in the semiconductor chip; an insulating film configured to cover a side wall and a bottom wall of the trench; and an embedded electrode embedded in the trench via the insulating film, wherein the bottom wall of the trench includes a protrusion protruding from a lower end of the insulating film toward an inner upper side of the insulating film in a depth direction of the trench.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
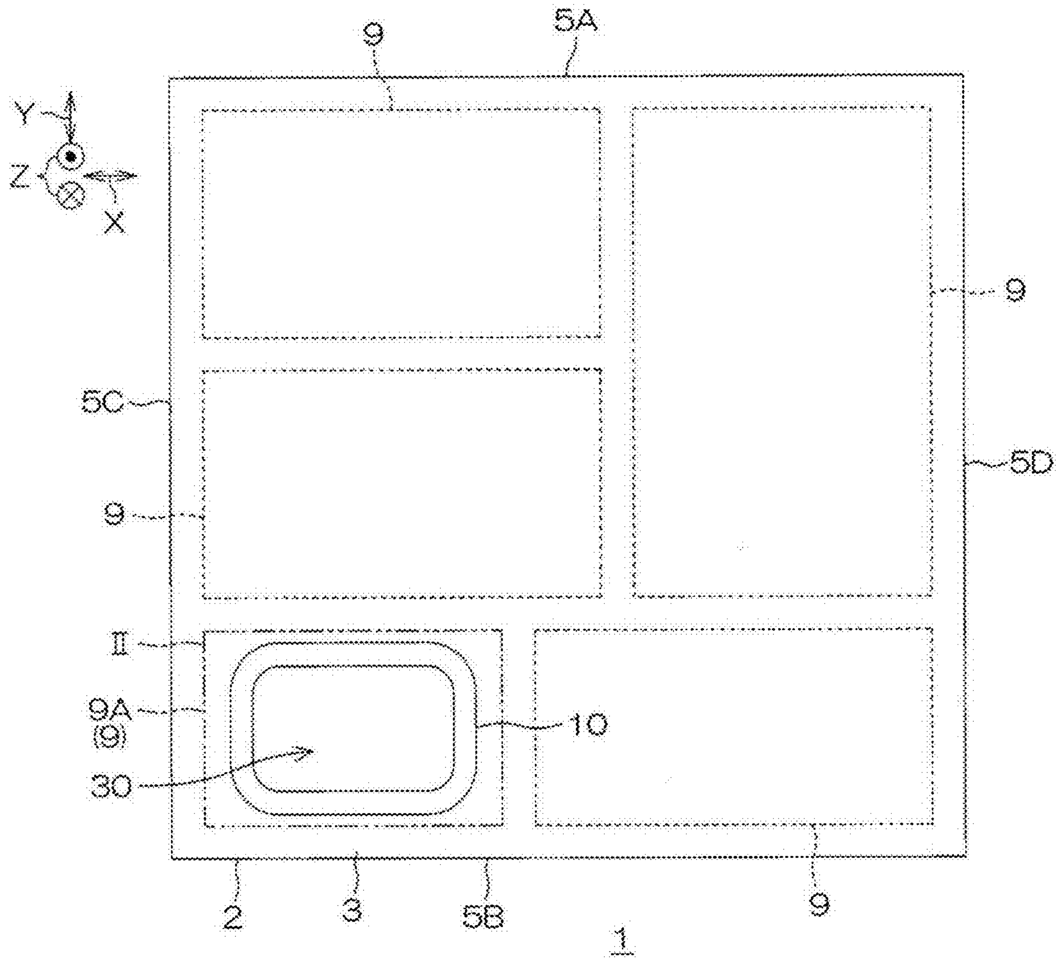
FIG. 1 is a schematic plan view of a semiconductor device according to an embodiment of the present disclosure.
Figure 2:
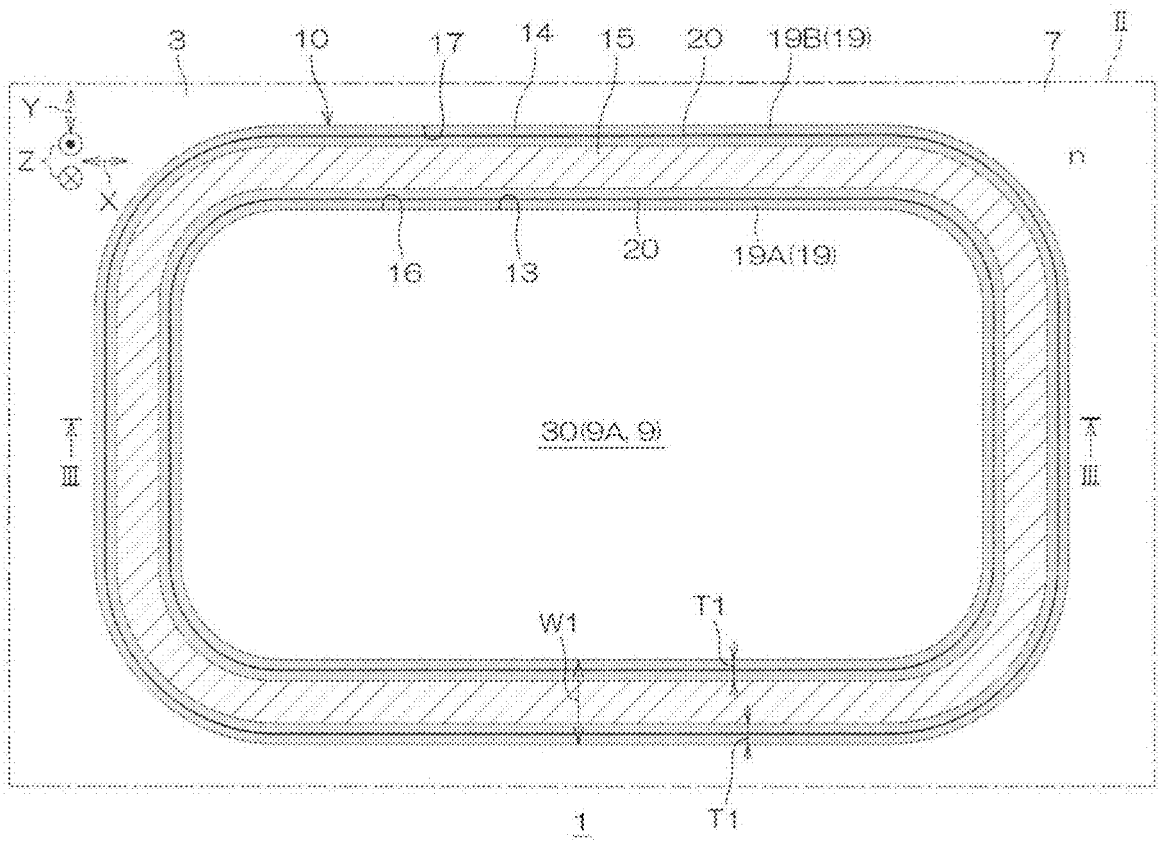
FIG. 2 is an enlarged view of a region surrounded by a two-dot chain line II in FIG. 1.
Figure 3:
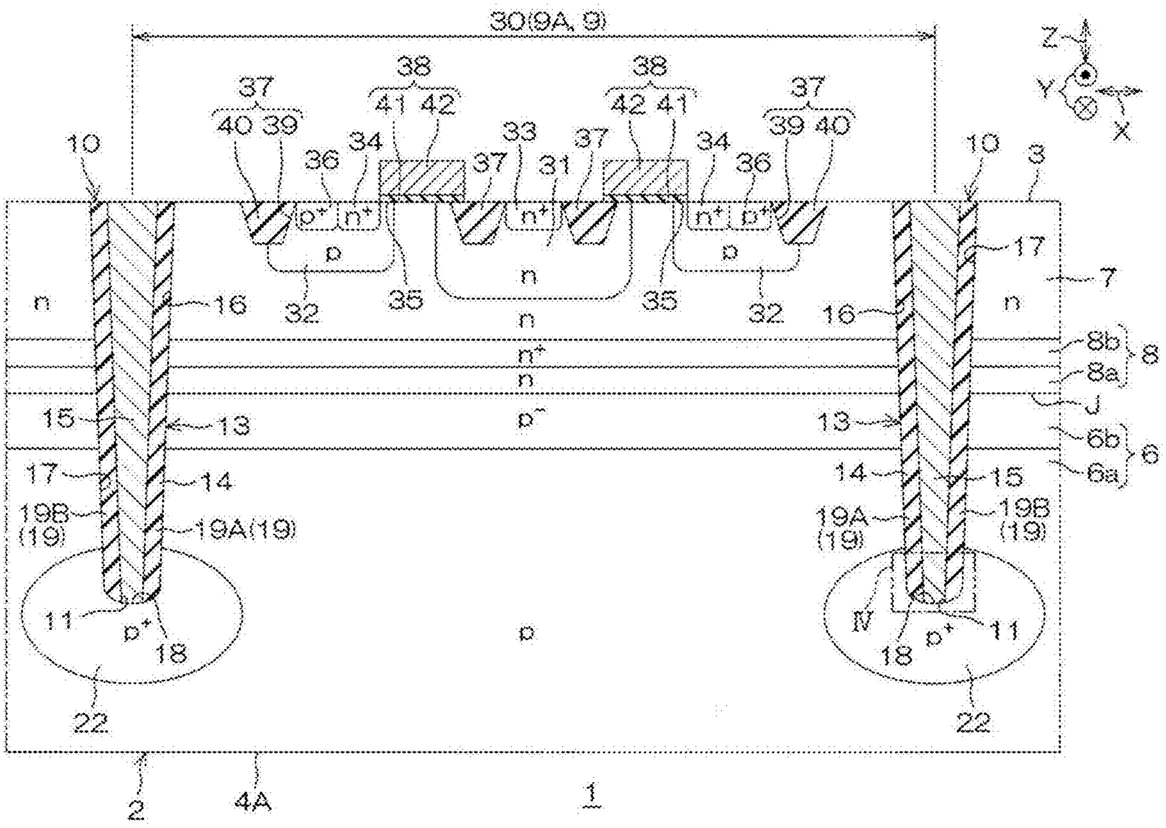
FIG. 3 is a diagram showing a cross section taken along line III-III in FIG. 2.

Next, embodiments of the present disclosure will be described in detail with reference to the accompanying drawings. Each component in the attached drawings is not necessarily shown exactly, but is shown schematically. The scales and the like between the drawings do not always match. FIG. 1 is a schematic plan view of a semiconductor device 1 according to an embodiment of the present disclosure. FIG. 2 is an enlarged view of a region surrounded by a two-dot chain line II in FIG. 1. FIG. 3 is a diagram showing a cross section taken along line III-III in FIG. 2.

The semiconductor device 1 includes a rectangular parallelepiped semiconductor chip 2. In the present embodiment, the semiconductor chip 2 is formed of a Si (silicon) chip. The semiconductor chip 2 has a first main surface 3 on one side, a second main surface 4 on the other side, and first to fourth side surfaces 5A to 5D connecting the first main surface 3 and the second main surface 4. The first main surface 3 and the second main surface 4 are formed in a rectangular shape in a plan view viewed from their normal direction Z (hereinafter simply referred to as "plan view"). The normal direction Z is also the thickness direction of the semiconductor chip 2. The first side surface 5A and the second side surface 5B extend in the first direction X along the first main surface 3 and face each other in the second direction Y intersecting (specifically, orthogonal to) the first direction X. The third side surface 5C and the fourth side surface 5D extend in the second direction Y and face each other in the first direction X.

The semiconductor device 1 includes a p-type first layer 6, a p-type or n-type second layer 7, and an n-type third layer 8 formed in the semiconductor chip 2. The first layer 6 may be referred to as a "base layer." The second layer 7 may be referred to as a "device forming layer." The third layer 8 may be referred to as an "embedded layer." The first layer 6, the second layer 7 and the third layer 8 may be regarded as components of the semiconductor chip 2.

The first layer 6 is formed in a region on a second main surface 4 side in the semiconductor chip 2 and forms a part of the second main surface 4 and the first to fourth side surfaces 5A to 5D. The first layer 6 may have a concentration gradient in which the p-type impurity concentration on a first main surface 3 side is lower than the p-type impurity concentration on the second main surface 4 side. Specifically, the first layer 6 may have a laminated structure including a high-concentration layer 6*a* and a low-concentration layer 6*b* stacked sequentially from the second main surface 4 side.

The high-concentration layer 6*a* has a relatively high p-type impurity concentration. The concentration of p-type impurities in the high-concentration layer 6*a* may be $1\times10^{16}$ $cm^{-3}$ or more and $1\times10^{20}$ $cm^{-3}$ or less. The high-concentration layer 6*a* may have a thickness of 100 μm or more and 100 μm or less. In this embodiment, the high-concentration layer 6*a* is made of a p-type semiconductor substrate (Si substrate). The low-concentration layer 6*b* has a lower p-type impurity concentration than the high-concentration layer 6*a*, and is stacked on the high-concentration layer 6*a*. The p-type impurity concentration of the low-concentration layer 6*b* may be $1\times10^{14}$ $cm^{-3}$ or more and $1\times10^{17}$ $cm^{-3}$ or less. The low-concentration layer 6*b* has a smaller thickness than the high-concentration layer 6*a*. The thickness of the low-concentration layer 6*b* may be 0.5 μm or more and 20 μm or less. In this embodiment, the low-concentration layer 6*b* is composed of a p-type epitaxial layer (Si epitaxial layer).

The second layer 7 is formed in the region on the first main surface 3 side in the semiconductor chip 2 and forms a part of the first main surface 3 and the first to fourth side surfaces 5A to 5D. The conduction type (n type or p type) of the second layer 7 is arbitrary and is selected according to the specification of the semiconductor device 1. In this embodiment, an example in which the conduction type of the second layer 7 is an n-type will be described. However, it is not intended to limit the conduction type of the second layer 7 to the n-type.

The second layer 7 may have a uniform n-type impurity concentration in the thickness direction, or may have an n-type impurity concentration gradient that rises toward the first main surface 3. The n-type impurity concentration in the second layer 7 may be $1\times10^{14}$ $cm^{-3}$ or more and $1\times10^{17}$ $cm^{-3}$ or less. The second layer 7 may have a thickness of 0.5 μm or more and 20 μm or less. In this embodiment, the second layer 7 is composed of an n-type epitaxial layer (Si epitaxial layer).

The third layer 8 is interposed in the region between the first layer 6 and the second layer 7 in the semiconductor chip 2 to form a part of the first to fourth side surfaces 5A to 5D of the semiconductor chip 2. The third layer 8 forms a pn junction portion J at a boundary with the first layer 6. That is, in the semiconductor chip 2, a pn junction portion J extending in the horizontal direction (orthogonal to the thickness direction) along the first main surface 3 is formed at the middle portion in the thickness direction between the first main surface 3 and the second main surface 4. The pn junction portion J may be referred to as a "pn connection portion" or a "pn boundary portion."

The third layer 8 may have a higher n-type impurity concentration than the second layer 7. Specifically, the third layer 8 may have a concentration gradient in which the n-type impurity concentration on the first main surface 3 side is higher than the n-type impurity concentration on the second main surface 4 side. More specifically, the third layer 8 may have a laminated structure that includes a low-concentration embedded layer 8*a* and a high-concentration embedded layer 8*b* stacked sequentially from the first layer 6 side.

The low-concentration embedded layer 8*a* has a relatively low n-type impurity concentration and is stacked on the low-concentration layer 6*b* of the first layer 6. The low-concentration embedded layer 8*a* forms the pn junction portion J between the low-concentration embedded layer 8*a* and the low-concentration layer 6*b*. The low-concentration embedded layer 8*a* may have a lower n-type impurity concentration than the second layer 7, or may have a higher n-type impurity concentration than the second layer 7. The n-type impurity concentration in the low-concentration embedded layer 8*a* may be $1\times10^{14}$ $cm^{-3}$ or more and $1\times10^{18}$ $cm^{-3}$ or less. The low-concentration embedded layer 8*a* may have a thickness of 0.1 μm or more and 5 μm or less. In this embodiment, the low-concentration embedded layer 8*a* is composed of an n-type epitaxial layer (Si epitaxial layer).

The high-concentration embedded layer 8*b* has a higher n-type impurity concentration than the low-concentration embedded layer 8*a*, and is stacked on the low-concentration embedded layer 8*a*. The high-concentration embedded layer 8*b* may have a higher n-type impurity concentration than the second layer 7. The n-type impurity concentration in the high-concentration embedded layer 8*b* may be $1\times10^{16}$ $cm^{-3}$ or more and $1\times10^{21}$ $cm^{-3}$ or less. The high-concentration embedded layer 8*b* may have a thickness of 0.1 μm or more and 5 μm or less. In this embodiment, the high-concentration embedded layer 8*b* is composed of an n-type epitaxial layer (Si epitaxial layer).

The semiconductor device 1 includes a plurality of element regions 9 installed on the first main surface 3 (second layer 7). The plurality of element regions 9 are regions in which a plural types of functional elements are formed respectively. The plurality of element regions 9 are partitioned in the inner portion of the first main surface 3 respectively at an interval from the first to fourth side surfaces 5A to 5D in a plan view. The number, arrangement and shape of the element regions 9 are arbitrary and are not limited to a specific number, arrangement and shape.

The plurality of functional elements may include at least one selected from the group of semiconductor switching elements, semiconductor rectifying elements and passive elements. The semiconductor switching elements may include at least one selected from the group of a JFET (Junction Field Effect Transistor), a MISFET (Metal Insulator Semiconductor Field Effect Transistor), a BJT (Bipolar Junction Transistor) and an IGBT (Insulated Gate Bipolar Junction Transistor).

The semiconductor rectifying elements may include at least one selected from the group of a pn junction diode, a pin junction diode, a Zener diode, a Schottky barrier diode and a fast recovery diode. The passive elements may include at least one selected from the group of a resistor, a capacitor, an inductor and a fuse. In this embodiment, the element regions 9 include at least one transistor region 9A. Hereinafter, the structure on a transistor region 9A side will be specifically described.

The semiconductor device 1 includes an element isolation structure 10 for partitioning the transistor region 9A on the first main surface 3. The element isolation structure 10 partitions the transistor region 9A of a predetermined shape in a plan view. The element isolation structure 10 may be referred to as a "trench electrode structure." Referring to FIG. 2, the element isolation structure 10 is formed in a band shape extending along the transistor region 9A in a plan view. In this embodiment, the element isolation structure 10 is formed in an annular shape (square ring shape in this embodiment) in a plan view and partitions the transistor region 9A having a predetermined shape (square shape in this embodiment). In this embodiment, the four corners of the element isolation structure 10 have a round shape which is curved in a direction away from the transistor region 9A in a plan view. The plan view shape of the element isolation structure 10 (the plan view shape of the transistor region 9A) is arbitrary. The element isolation structure 10 may be formed in a polygonal ring shape, a circular ring shape or an elliptical ring shape in a plan view, and may partition the transistor region 9A having a polygonal shape, a circular shape or an elliptical shape in a plan view.

The element isolation structure 10 has a trench width W1. The trench width W1 is a width in a direction orthogonal to the direction in which the element isolation structure 10 extends in a plan view. The trench width W1 may be 0.5 μm or more and 10 μm or less. The trench width W1 may be 2 μm or more and 4 μm or less. Referring to FIG. 3, the element isolation structure 10 is formed on the first main surface 3 so as to penetrate the pn junction portion J and partitions the transistor region 9A on the first main surface 3. Specifically, the element isolation structure 10 penetrates the second layer 7 and the third layer 8 so as to reach the first layer 6, and partitions the transistor region 9A in the second layer 7. In this embodiment, the element isolation structure 10 extends from the first main surface 3 toward the second main surface 4 so as to reach the high-concentration layer 6*a* of the first layer 6, and penetrates the second layer 7, the third layer 8 and the low-concentration layer 6*b* of the first layer 6.

The element isolation structure 10 includes an inner peripheral wall on the transistor region 9A side, an outer peripheral wall on the opposite side of the inner peripheral wall (on the peripheral edge side of the semiconductor chip 2), and a bottom wall connecting the inner peripheral wall and the outer peripheral wall. The element isolation structure 10 is electrically connected to the semiconductor chip 2 at the bottom wall thereof and is electrically insulated from the semiconductor chip 2 at the side wall (inner peripheral wall and outer peripheral wall) thereof. That is, the element isolation structure 10 includes a lower end portion electrically connected to the semiconductor chip 2. Specifically, the element isolation structure 10 is electrically connected to the first layer 6 and is electrically insulated from the second layer 7 and the third layer 8. That is, the element isolation structure 10 is fixed at the same potential as the first layer 6.

The element isolation structure 10 includes a trench 13, a trench insulating film 14, and a trench electrode 15. Referring to FIG. 2, the trench 13 is formed in an annular shape in a plan view. The width of the trench 13 may be the trench width W1 described above. Referring to FIG. 3, the trench 13 is formed on the first main surface 3 side of the semiconductor chip 2 so as to penetrate the pn junction portion J. Specifically, the trench 13 penetrates the second layer 7 and the third layer 8 so as to reach the first layer 6. In this embodiment, the trench 13 extends from the first main surface 3 toward the second main surface 4 so as to reach the high-concentration layer 6*a* of the first layer 6, and penetrates the second layer 7, the third layer 8 and the low-concentration layer 6*b* of the first layer 6.

The trench 13 includes an inner peripheral wall 16 on the transistor region 9A side, an outer peripheral wall 17 on the opposite side of the inner peripheral wall 16 (on the peripheral side of the semiconductor chip 2), and a bottom wall 18 connecting the inner peripheral wall 16 and the outer peripheral wall 17. The inner peripheral wall 16 and the outer peripheral wall 17 may be referred to as an "inner side wall" and an "outer side wall," respectively, or may be referred to as a "first side wall" and a "second side wall," respectively. The trench insulating film 14 covers the inner peripheral wall 16 and the outer peripheral wall 17 of the trench 13 so as to expose the semiconductor chip 2 from the bottom wall 18 of the trench 13. Specifically, the trench insulating film 14 exposes the first layer 6 from the bottom wall 18 of the trench 13. In this embodiment, the trench insulating film 14 exposes the high-concentration layer 6*a* of the first layer 6 from the bottom wall 18 of the trench 13. The trench insulating film 14 may cover an entire region of the inner peripheral wall 16 and an entire region of the outer peripheral wall 17 of the trench 13. The trench insulating film 14 may include a silicon oxide film. The trench insulating film 14 may include a silicon oxide film made of an oxide of the semiconductor chip 2.

The trench electrode 15 is embedded in the trench 13 with the trench insulating film 14 interposed therebetween and is electrically connected to the semiconductor chip 2 at the bottom wall 18 of the trench 13. Specifically, the trench electrode 15 is electrically connected to the first layer 6 and is electrically insulated from the second layer 7 and the third layer 8. The trench electrode 15 may contain conductive polysilicon. The trench electrode 15 may contain conductive polysilicon having the same conduction type (p type in this embodiment) as the first layer 6. The p-type impurity of the trench electrode 15 may be boron.

The semiconductor device 1 includes a p-type impurity region 22 formed in a region extending along the bottom wall 18 of the trench 13 in the semiconductor chip 2. The impurity region 22 is formed in the first layer 6 so as to cover the bottom wall 18 of the trench 13. The impurity region 22 has a higher p-type impurity concentration than the first layer 6. Specifically, the impurity region 22 is formed in the high-concentration layer 6*a* of the first layer 6 and has a higher p-type impurity concentration than the high-concentration layer 6*a*.

In this embodiment, the trench electrode 15 is formed as a source of a p-type impurity for the first layer 6, and the impurity region 22 contains the p-type impurity of the first layer 6 and the p-type impurity of the trench electrode 15. The impurity region 22 also covers the inner peripheral wall 16 and the outer peripheral wall 17 of the trench 13. The impurity region 22 may be formed in the high-concentration layer 6*a* of the first layer 6 at an interval from the low-concentration layer 6*b* of the first layer 6.

Referring to FIG. 3, the semiconductor device 1 includes a planar gate type MISFET 30 as an example of a functional element formed in the transistor region 9A. In FIG. 2, the illustration of the MISFET 30 is omitted. The MISFET 30 may take any one form of a HV (high voltage)-MISFET (for, e.g., 100 V or more and 1000 V or less), a MV (middle voltage)-MISFET (for example, 30 V or more and 100 V or less) and a LV (low voltage)-MISFET (for example, 1 V or more and 30 V or less). In this embodiment, an example in which the MISFET 30 is composed of the HV-MISFET will be described. However, the embodiment of the MISFET 30 is not limited to the HV-MISFET.

The MISFET 30 is composed of at least one MISFET cell formed in the transistor region 9A. In this embodiment, when seen in a cross-sectional view, the MISFET cell includes at least one (one in this embodiment) n-type first well region 31, at least one (multiple in this embodiment) p-type second well region 32, at least one (multiple in this embodiment) n-type drain region 33, at least one (multiple in this embodiment) n-type source region 34, at least one (multiple in this embodiment) p-type channel region 35, at least one (multiple in this embodiment) p-type contact regions 36, multiple shallow trench structures 37, and at least one (multiple in this embodiment) planar gate structure 38. The shallow trench structure 37 may be referred to as a "STI (shallow trench isolation) structure."

The first well region 31 is formed in the surface layer portion of the second layer 7 in the transistor region 9A. The first well region 31 has a higher n-type impurity concentration than the second layer 7. The second well regions 32 are formed on the surface layer portion of the second layer 7 at an interval from the first well region 31 in the transistor region 9A. One second well region 32 is formed at an interval from the first well region 31 to one side in a first direction X, and the other second well region 32 is formed at an interval from the first well region 31 to the other side in the first direction X.

The drain region 33 is formed in the surface layer portion of the first well region 31 at an interval inward from the peripheral edge of the first well region 31. The source regions 34 are formed in the surface layer portions of the corresponding second well regions 32 at an interval inward from the peripheral edges of the corresponding second well regions 32. The channel regions 35 are formed between the second layer 7 and the corresponding source regions 34 in the surface layer portions of the corresponding second well regions 32, respectively. The contact regions 36 are formed in the surface layer portions of the corresponding second well regions 32 at an interval inward from the peripheral edges of the corresponding second well regions 32. The contact regions 36 are adjacent to the corresponding source regions 34.

The shallow trench structures 37 are formed in the second layer 7 at an interval from the third layer 8 in the thickness direction of the second layer 7. The shallow trench structures 37 may be formed at depth positions at an interval from the bottom of the first well region 31 and the bottom of the second well region 32 toward the first main surface 3. The shallow trench structures 37 are formed along the peripheral edge of the drain region 33 to separate the drain region 33 from other regions.

The shallow trench structures 37 are formed along the outer edges (the peripheral edges on the side of the element isolation structure 10) of the second well regions 32 to separate the second well regions 32 from other regions. Each of the shallow trench structures 37 includes a shallow trench 39 and an embedded insulator 40. Each shallow trench 39 is formed on the first main surface 3. Each embedded insulator 40 is embedded in the shallow trench 39.

The planar gate structures 38 are respectively formed on the second layer 7 (first main surface 3) so as to cover the corresponding channel regions 35 and are configured to control the on/off operation of the corresponding channel regions 35. In this embodiment, the planar gate structures 38 are formed so as to straddle the first well region 31 and the corresponding source regions 34, respectively. The planar gate structures 38 may cover a part of the shallow trench structures 37 that partition the drain regions 33.

The planar gate structures 38 include a gate insulating film 41 and a gate electrode 42 stacked sequentially from the second layer 7 side. The gate insulating film 41 may include a silicon oxide film. The gate insulating film 41 may include a silicon oxide film made of an oxide of the semiconductor chip 2. The gate electrode 42 may contain conductive polysilicon. The gate electrode 42 contains conductive polysilicon having the same conduction type (i.e., p type) as that of the first layer 6. The p-type impurity of the gate electrode 42 may be boron. Of course, the conduction type of the gate electrode 42 may be an n-type.

Figure 4:
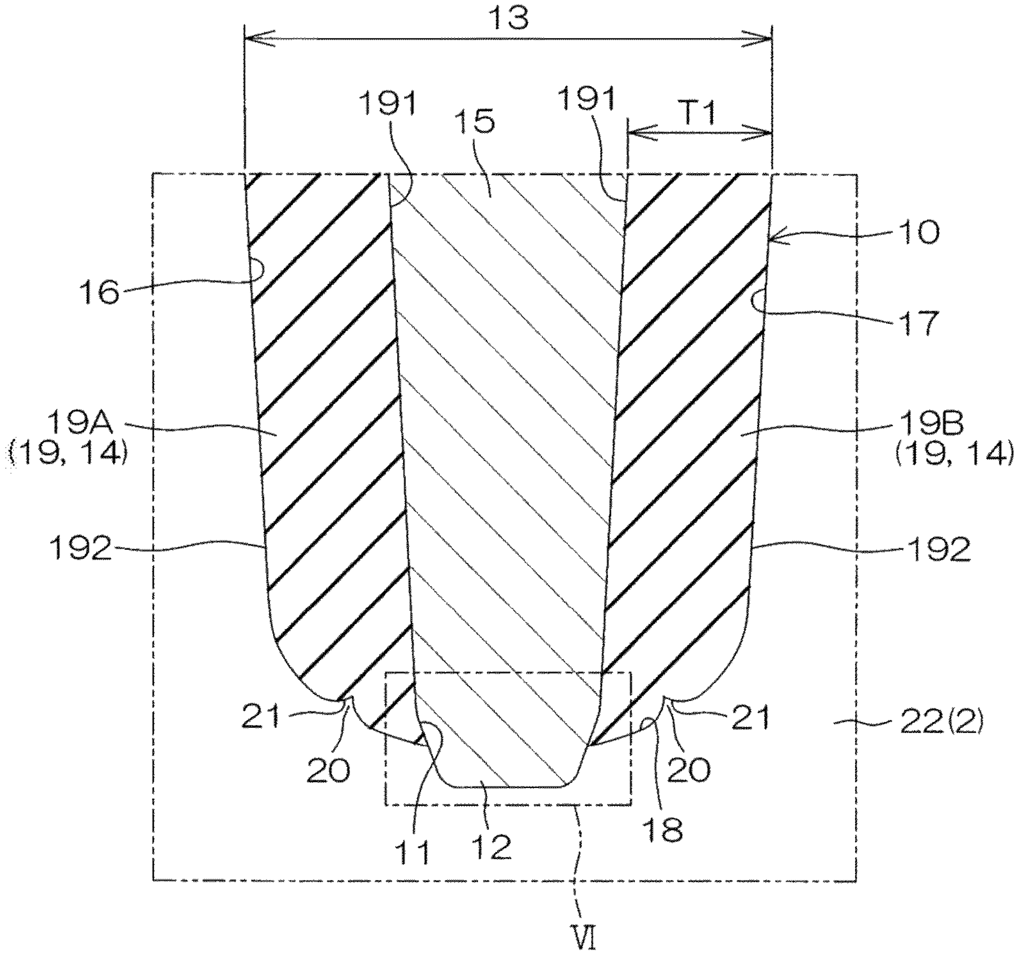
FIG. 4 is an enlarged view of a region surrounded by a two-dot chain line IV in FIG. 3, showing a first form of an element isolation structure.
Figure 5:
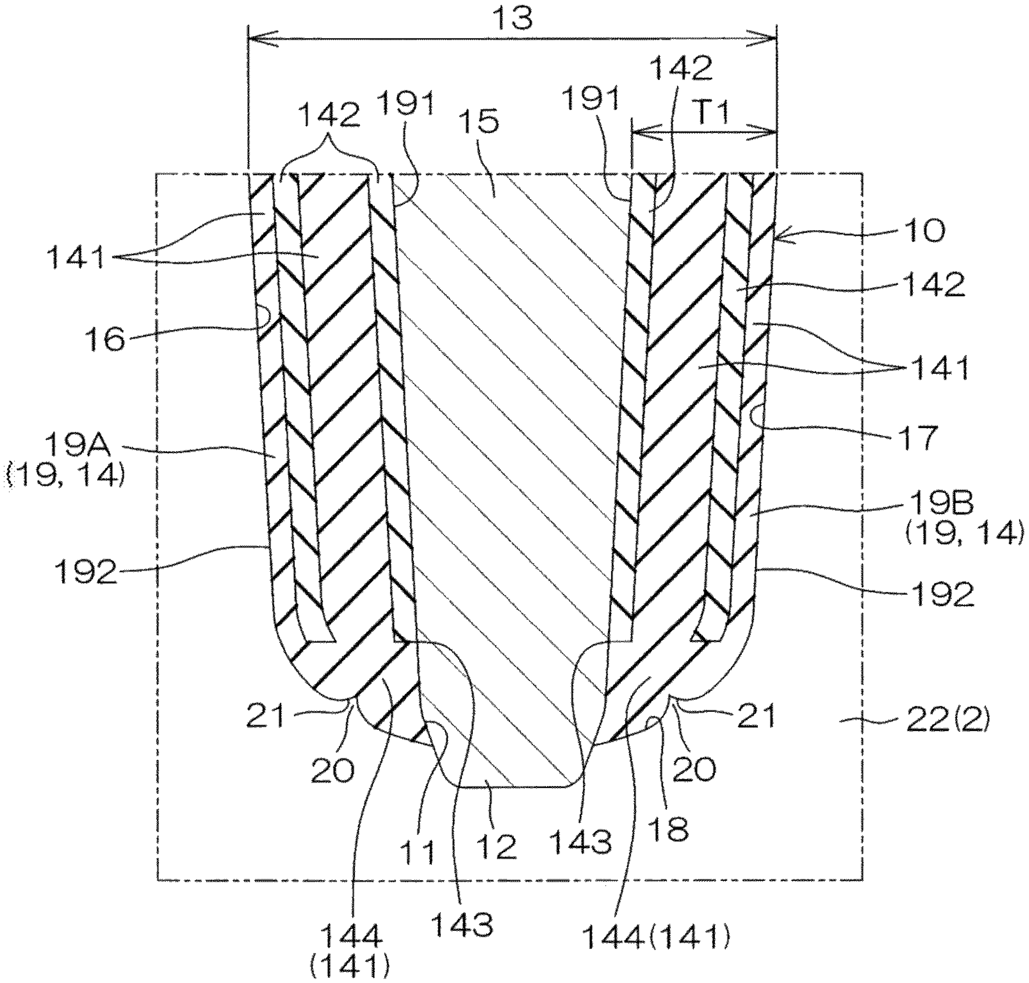
FIG. 5 is an enlarged view of the region surrounded by the two-dot chain line IV in FIG. 3, showing a second form of an element isolation structure.
Figure 6A:
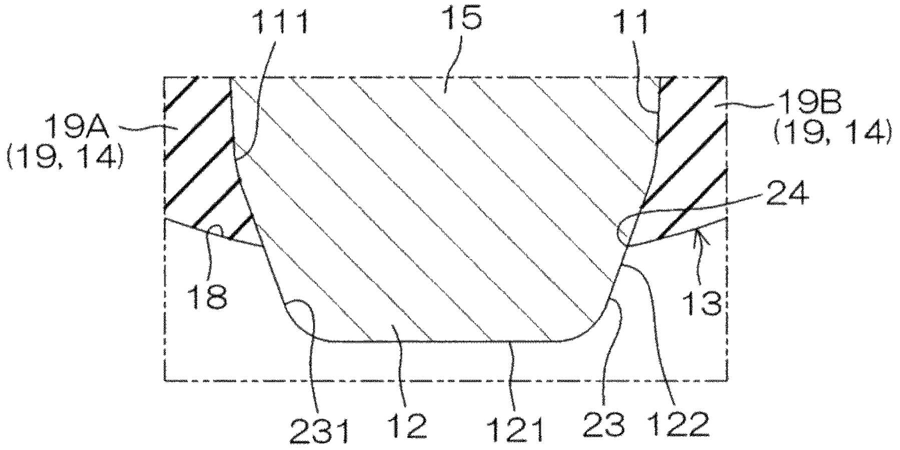
FIG. 6A is an enlarged view of a region surrounded by a two-dot chain line VI in FIG. 4, showing a first form of a contact portion.
Figure 6B:
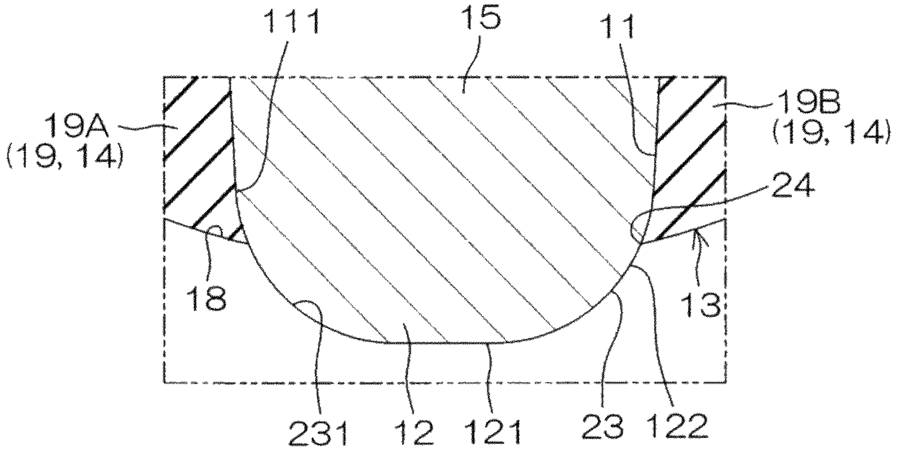
FIG. 6B is an enlarged view of the region surrounded by the two-dot chain line VI in FIG. 4, showing a second form of the contact portion.
Figure 6C:
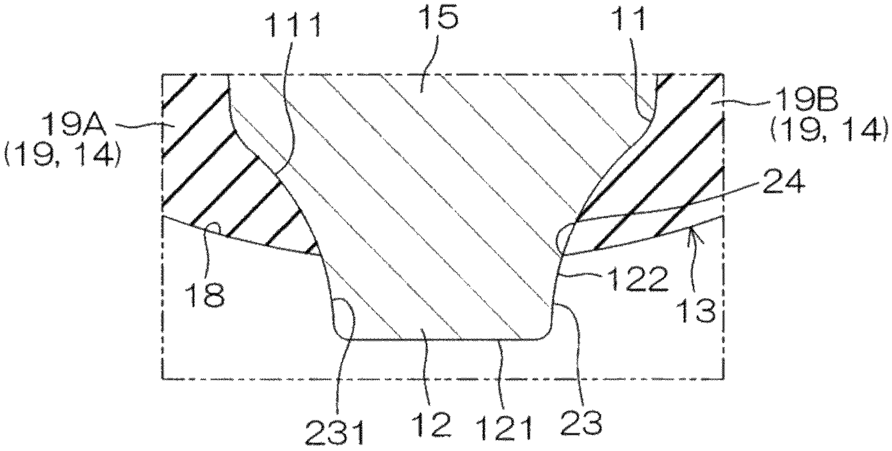
FIG. 6C is an enlarged view of the region surrounded by the two-dot chain line VI in FIG. 4, showing a third form of the contact portion.

FIG. 4 is an enlarged view of a region surrounded by a two-dot chain line IV in FIG. 3, showing a first form of the element isolation structure 10. FIG. 5 is an enlarged view of a region surrounded by the two-dot chain line IV in FIG. 3, showing a second form of the element isolation structure 10. FIGS. 6A to 6C are enlarged views of a region surrounded by a two-dot chain line VI in FIG. 4, showing first to third forms of the contact portion 12, respectively. Next, the configuration of the element isolation structure 10 will be described in more detail.

As described above, the element isolation structure 10 includes the trench 13, the trench insulating film 14, and the trench electrode 15. The trench insulating film 14 covers the inner peripheral wall 16 and the outer peripheral wall 17 of the trench 13. On the other hand, the trench insulating film 14 exposes the semiconductor chip 2 from the bottom wall 18 of the trench 13. The trench insulating film 14 may be referred to as a pair of side wall insulating films 19 formed along the inner peripheral wall 16 and the outer peripheral wall 17 of the trench 13 in the depth direction. The side wall insulating film 19 may have a first surface 191 and a second surface 192 that are substantially parallel to the inner peripheral wall 16 and the outer peripheral wall 17. The second surface 192 of the side wall insulating film 19 may be a surface in contact with the inner peripheral wall 16 and the outer peripheral wall 17, and the first surface 191 of the side wall insulating film 19 may be a surface on the opposite side thereof.

A thickness T1 of the side wall insulating film 19 may be, for example, 2 μm or more and 6 μm or less. The thickness T1 may be defined as a thickness in the direction intersecting the depth direction of the trench 13. Further, the pair of side wall insulating films 19 may be distinguished as a first side wall insulating film 19A on an inner peripheral wall 16 side and a second side wall insulating film 19B on an outer peripheral wall 17 side. For example, referring to FIG. 2, the first side wall insulating film 19A and the second side wall insulating film 19B are shown in gray regions. The first side wall insulating film 19A is formed on the inner peripheral wall 16 along the circumferential direction of the annular trench 13 in a plan view. The second side wall insulating film 19B is formed on the outer peripheral wall 17 along the circumferential direction of the annular trench 13 in a plan view. The first side wall insulating film 19A and the second side wall insulating film 19B are formed concentrically with each other. The second side wall insulating film 19B surrounds the first side wall insulating film 19A.

As shown in FIGS. 4 and 5, the trench 13 may be formed in a tapered shape having an opening width that narrows toward the bottom wall 18 in a cross-sectional view. Although not shown, the trench 13 may be formed in a vertical shape having a substantially constant opening width in a cross-sectional view. As shown in FIGS. 4 and 5, the bottom wall 18 of the trench 13 may be formed in a curved shape that bulges in the depth direction of the trench 13. Although not shown, the bottom wall 18 of the trench 13 may have a flat surface parallel to the first main surface 3.

The bottom wall 18 of the trench 13 may include a protrusion 20 protruding from the lower end of the side wall insulating film 19 toward an inner upper side of the side wall insulating film 19 in the depth direction of the trench 13. The protrusion 20 is fitted to the lower end portion of each of the first side wall insulating film 19A and the second side wall insulating film 19B. As a result, a recess 21 corresponding to the shape of the protrusion 20 is formed at the lower end of each of the first side wall insulating film 19A and the second side wall insulating film 19B. Referring to FIG. 2, in a plan view, the protrusion 20 is formed annularly to overlap with the first side wall insulating film 19A and the second side wall insulating film 19B, along the circumferential direction of the first side wall insulating film 19A and the second side wall insulating film 19B which have an annular shape. Since the protrusion 20 is continuous over the entire circumference of each of the first side wall insulating film 19A and the second side wall insulating film 19B in a plan view, it may be referred to as an "annular convex portion." Therefore, the recess 21 corresponding to the shape of the protrusion 20 may be referred to as an "annular concave portion."

Referring to FIG. 5, the trench insulating film 14 may include a first film portion 141 having a relatively high density and a second film portion 142 having a lower density than the first film portion 141. As shown in FIG. 5, a film interface that can be clearly partitioned may or may not exist between the first film portion 141 and the second film portion 142. The density of the films can be compared, for example, by etching the first film portion 141 and the second film portion 142 with a common etching gas or etching solution and measuring a difference between etching rates of the first film portion 141 and the second film portion 142 at that time. For example, when the first film portion 141 and the second film portion 142 are etched with a common etching gas or etching solution, the etching rate of the first film portion 141 having a relatively high density may be lower than the etching rate of the second film portion 142. When the trench insulating film 14 is made of silicon oxide, hydrofluoric acid (HF) may be used as the common etching gas.

In this embodiment, the second film portion 142, the first film portion 141, the second film portion 142 and the first film portion 141 are formed sequentially from the trench electrode 15 toward the inner peripheral wall 16 and the outer peripheral wall 17 of the trench 13 in the direction intersecting the depth direction of the trench 13. Each first film portion 141 and each second film portion 142 extend in the depth direction of the trench 13. At least the inner peripheral wall 16 and the outer peripheral wall 17 of the trench 13, and the bottom wall 18 are covered with the first film portion 141. Therefore, the protrusion 20 of the bottom wall 18 of the trench 13 protrudes into an interior of the first film portion 141. In the trench insulating film 14, the second film portion 142, the first film portion 141, the second film portion 142 and the first film portion 141 may extend from the first film portion 141 as the base film portion 144 covering the bottom wall 18 toward the opening end of the trench 13 (upward). Meanwhile, the lower portion of the side surface of the trench electrode 15 may be covered with the first film portion 141 (base film portion 144), and the portion other than the lower portion of the side surface of the trench electrode 15 may be covered with the second film portion 142. The trench electrode 15 may cross the boundary portion 143 between the first film portion 141 and the second film portion 142 covering the bottom wall 18 in the depth direction of the trench 13.

Referring to FIGS. 6A and 6B, the region sandwiched between the pair of side wall insulating films 19 and configured to expose the bottom wall 18 of the trench 13 may be the contact hole 11 of the trench insulating film 14. The trench electrode 15 may include a contact portion 12 connected to the semiconductor chip 2 via the contact hole 11. In this embodiment, the bottom wall 18 of the trench 13 has a recess 23 continuous with the contact hole 11. The side surface 111 of the contact hole 11 and the side surface 231 of the recess 23 are flush with each other. The contact portion 12 of the trench electrode 15 is formed in the recess 23 via the contact hole 11.

In this embodiment, the contact portion 12 of the trench electrode 15 includes a bottom portion 121 extending along the bottom wall 18 of the trench 13, and a side portion 122 extending upward from the bottom portion 121 and crossing the boundary portion 24 between the trench insulating film 14 and the bottom wall 18 of the trench 13. The bottom portion 121 of the contact portion 12 may have a flat shape in a cross-sectional view. The side portion 122 of the contact portion 12 may have a flat shape in a cross-sectional view as shown in FIG. 6A or a curved shape in a cross-sectional view as shown in FIGS. 6B and 6C. As shown in FIG. 6B, the side portion 122 of the contact portion 12 may be curved in a convex shape so as to bulge outward with respect to the trench 13, or as shown in FIG. 6C, the side portion 122 of the contact portion 12 may be curved in a concave shape so as to bulge inward with respect to the trench 13.

Figure 7:
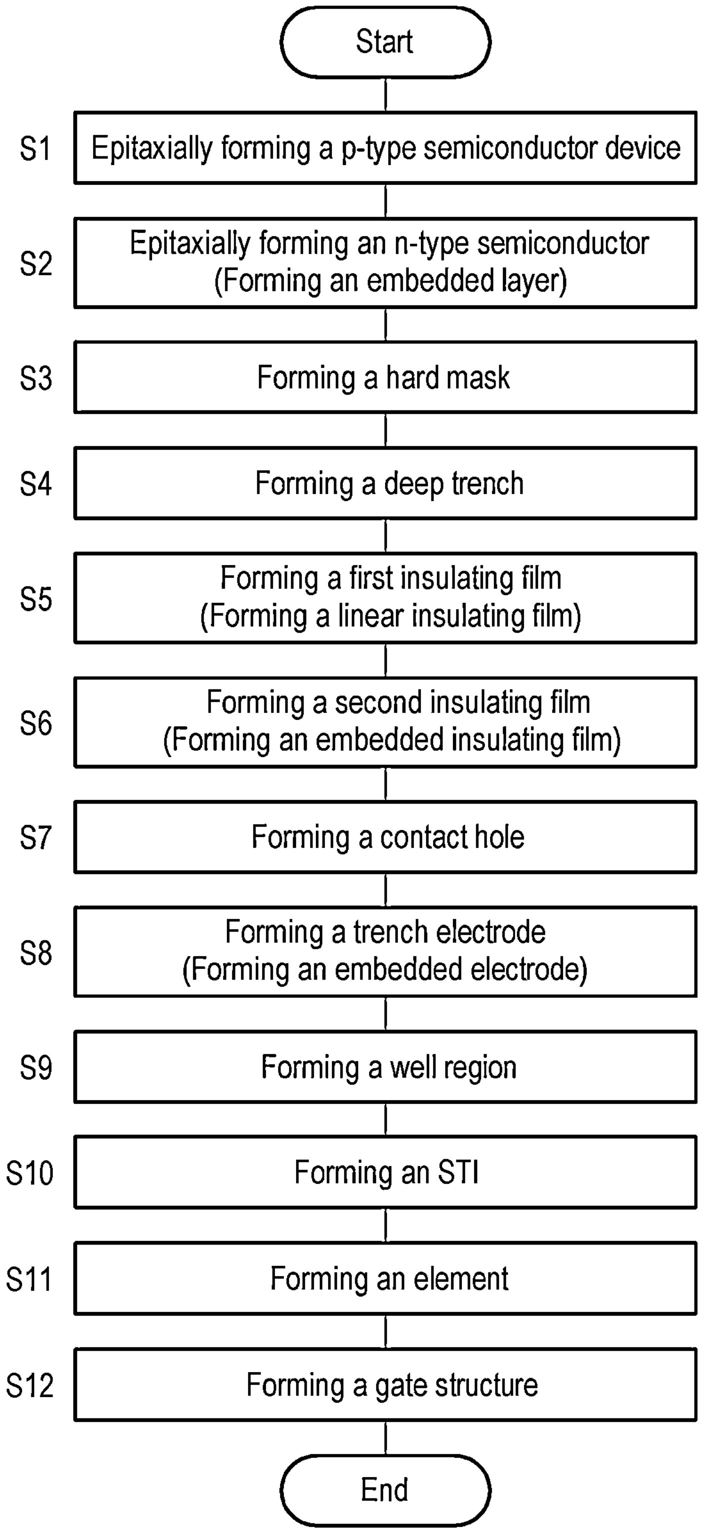
FIG. 7 is a diagram showing a flow of a semiconductor device manufacturing process.

FIG. 7 is a view showing a flow of a manufacturing process of the semiconductor device 1. FIGS. 8A, 8B to 12A, and 12B are schematic views showing a part of the manufacturing process of the semiconductor device 1 in the order of steps. In FIGS. 8A, 8B to 12A, and 12B, the view with "A" attached to the drawing number is a plan view, and the view with "B" attached to the drawing number is a cross-sectional view. In FIGS. 7, 8A, 8B to 12A, and 12B, some steps such as a step of forming the impurity region 22 and the like are omitted.

Figure 8A:
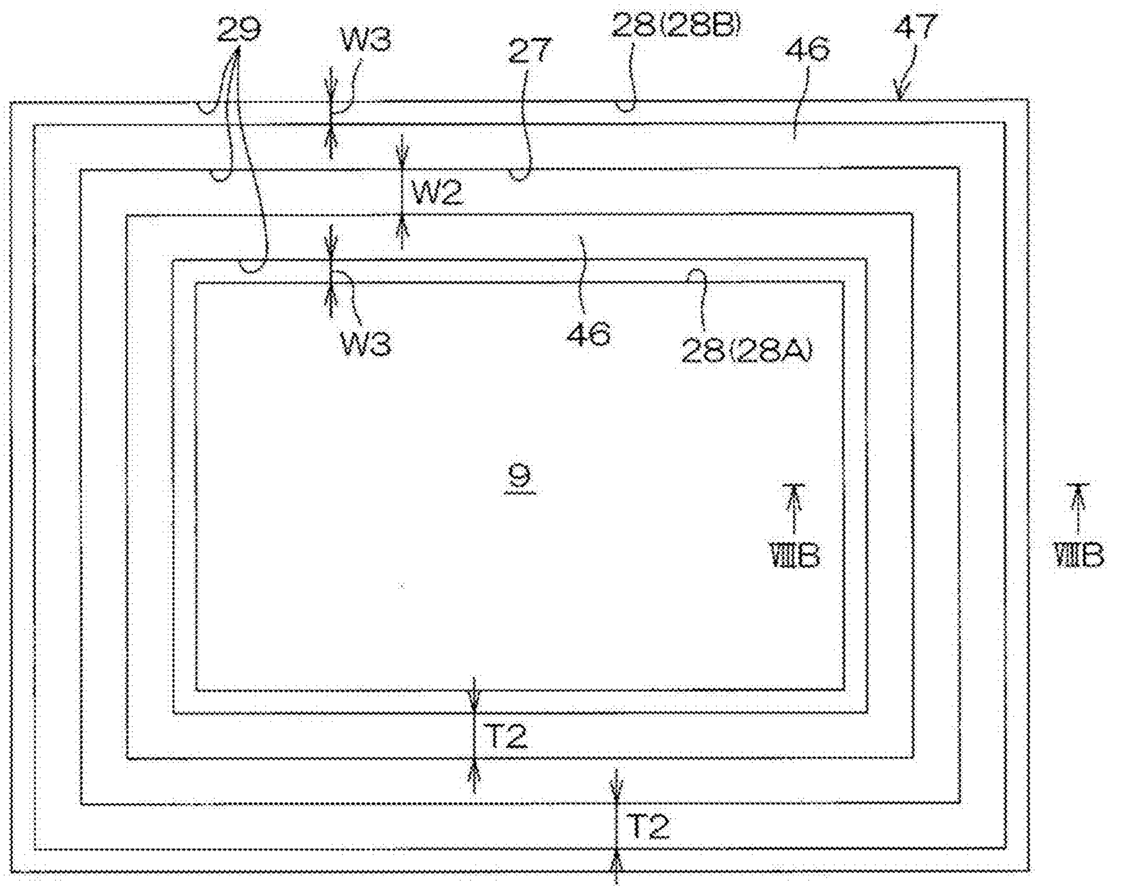
FIG. 8A is a schematic plan view showing a part of the semiconductor device manufacturing process.
Figure 8B:
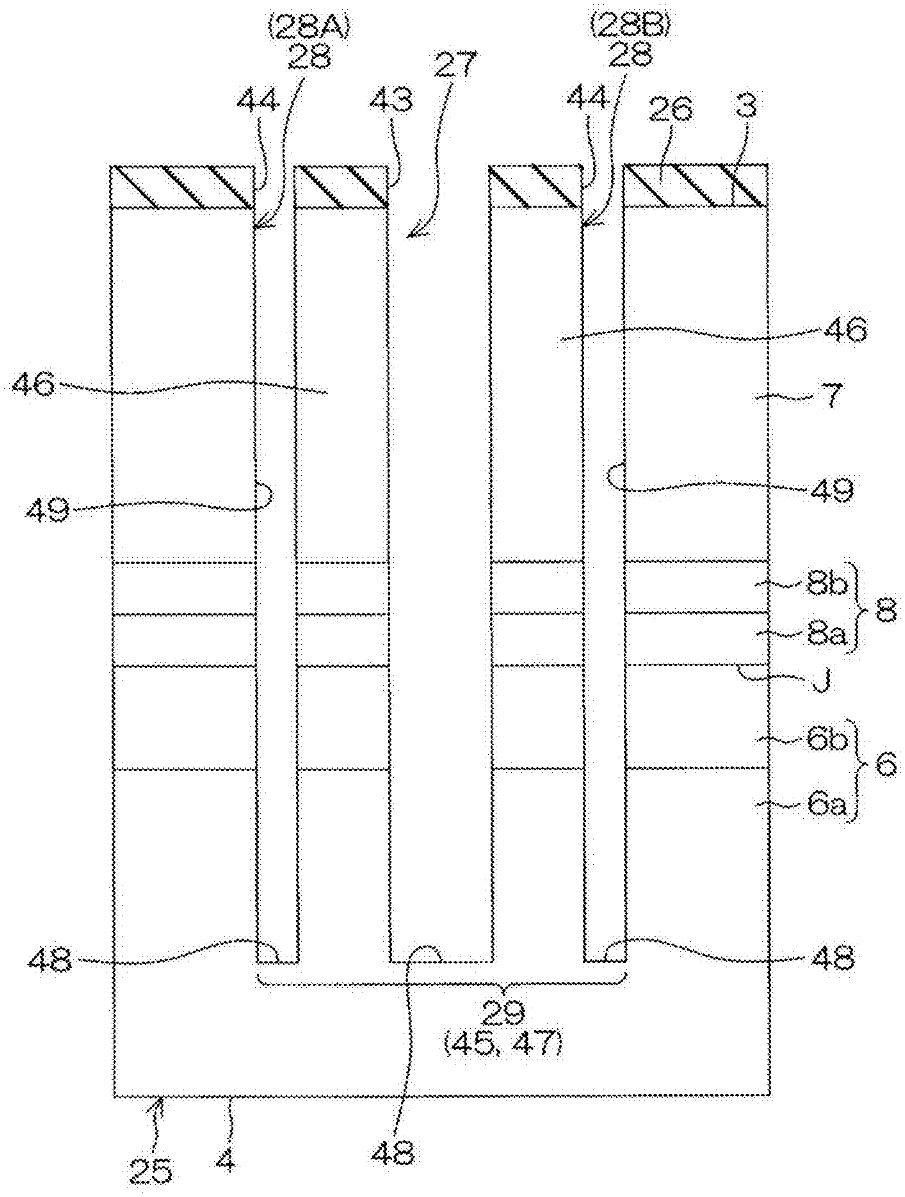
FIG. 8B is a schematic cross-sectional view showing a part of the semiconductor device manufacturing process.

In order to manufacture the semiconductor device 1, as shown in FIGS. 7, 8A and 8B, a p-type semiconductor wafer 25 (high-concentration layer 6*a*), which is a source of the semiconductor chip 2, is prepared, and a p-type epitaxial layer (low-concentration layer 6*b*) is formed on the semiconductor wafer 25 (step S1). In the next step, the embedded layer (third layer 8) is formed (step S2). For example, an n-type impurity (e.g., phosphorus) is injected into a surface of the low-concentration layer 6*b*. Next, a second layer 7 is formed on the first layer 6 by epitaxially growing silicon on the low-concentration layer 6*b* while introducing an n-type impurity. Thereafter, by performing an annealing treatment, the n-type impurity injected into the surface of the low-concentration layer 6*b* is diffused on both sides in the thickness direction of the semiconductor wafer 25. As a result, a third layer 8 (embedded layer) is formed between the first layer 6 and the second layer 7. The obtained semiconductor wafer 25 has a first main surface 3 and a second main surface 4 which have been described above.

Next, a hard mask 26 is formed on the first main surface 3 of the semiconductor wafer 25 (step S3). The hard mask 26 includes a first opening 43 and a second opening 44 corresponding to the shapes of a main trench 27 and a sub-trench 28, which will be described later, respectively. Next, a deep trench 29 is formed in the semiconductor wafer 25 by etching the semiconductor wafer 25 via the hard mask 26 (step S4). The deep trench 29 is formed to penetrate the second layer 7, the third layer 8, and the pn junction portion J and reach the first layer 6. The element region 9 is partitioned on the semiconductor wafer 25 by the deep trench 29.

Here, the deep trench 29 includes at least three annular shape deep trenches 29 that are concentrically arranged with each other and physically separated from each other. Specifically, the deep trench 29 may be a trench group 45 including a main trench 27 and a plurality of sub-trenches 28 arranged inside and outside the main trench 27 and having a width narrower than that of the main trench 27. In this embodiment, the same number of sub-trenches 28 (one in FIGS. 8A and 8B) are formed on both inside and outside of the main trench 27. The sub-trenches 28 may include an inner sub-trench 28A arranged on a side (inside) of the element region 9 with regard to the main trench 27 and surrounded by the main trench 27, and an outer sub-trench 28B arranged on an opposite side (outside) of the element region 9 with regard to the main trench 27 and surrounding the main trench 27. The inner sub-trench 28A and the outer sub-trench 28B may be referred to as a "first sub-trench" and a "second sub-trench," respectively.

A width W2 of the main trench 27 may be, for example, 2.5 μm or more and 3 μm or less, and a width W3 of the sub-trench 28 may be, for example, 1 μm or more and 1.5 μm or less. In the trench group 45, since the deep trenches 29 are an annular shape physically separated from each other, semiconductor wall portions 46 formed by utilizing a part of the semiconductor wafer 25 are formed between the adjacent deep trenches 29. Referring to FIG. 8A, the respective semiconductor wall portions 46 are formed in a strip shape along the circumferential direction of the trench group 45 in a plan view and form a boundary between adjacent deep trenches 29. Referring to FIG. 8B, for example, the semiconductor wall portion 46 may define the entire deep trenches 29 belonging to the trench group 45 as one wide trench 47 and may be erected on the bottom wall 48 of the trench 47. The semiconductor wall portion 46 faces the side wall 49 of the trench 47 across a space composed of the sub-trench 28. The thickness T2 of the semiconductor wall portion 46 may be, for example, 1 μm or less. Therefore, in the next thermal oxidation step, the semiconductor wall portion 46 can be easily modified into an insulator wall portion 51.

Figure 9A:
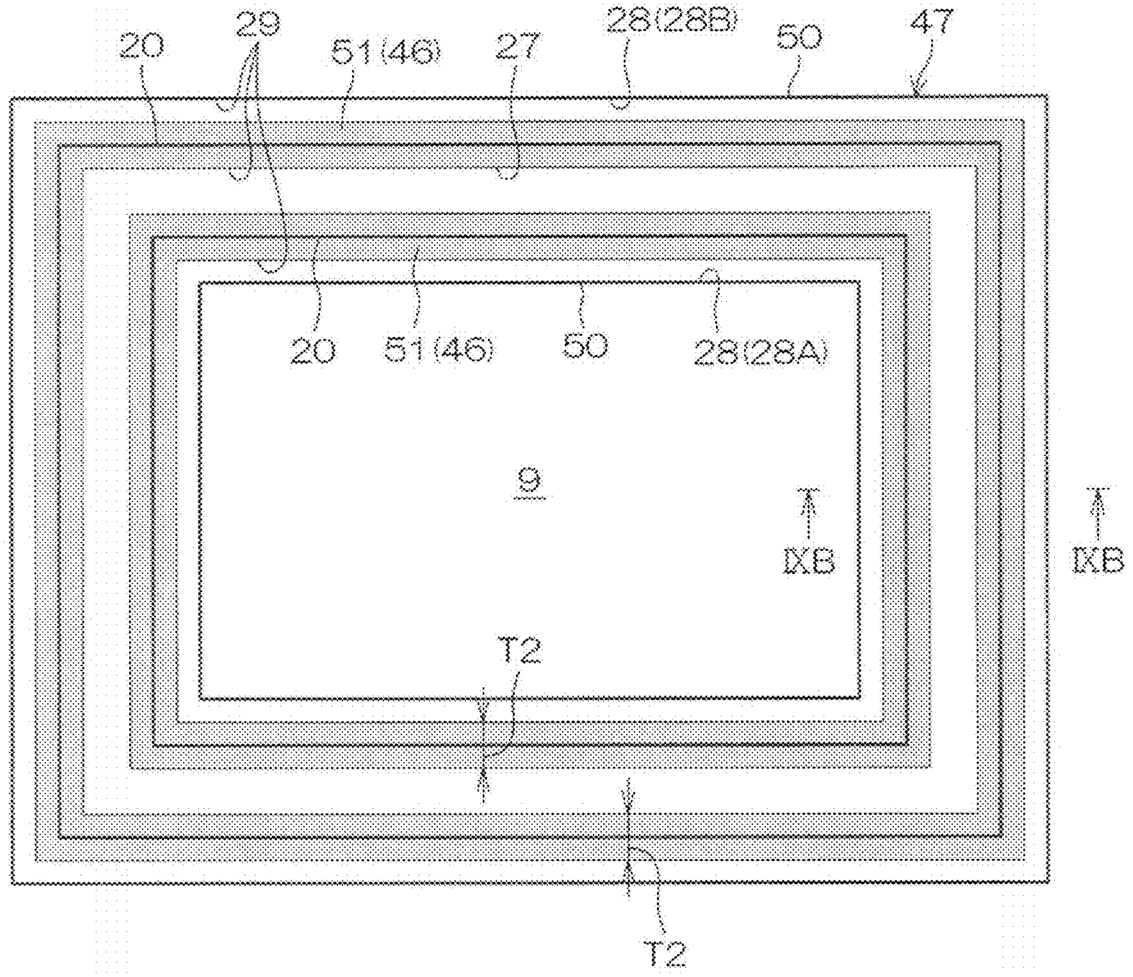
FIG. 9A is a diagram showing the next step of FIG. 8A.
Figure 9B:
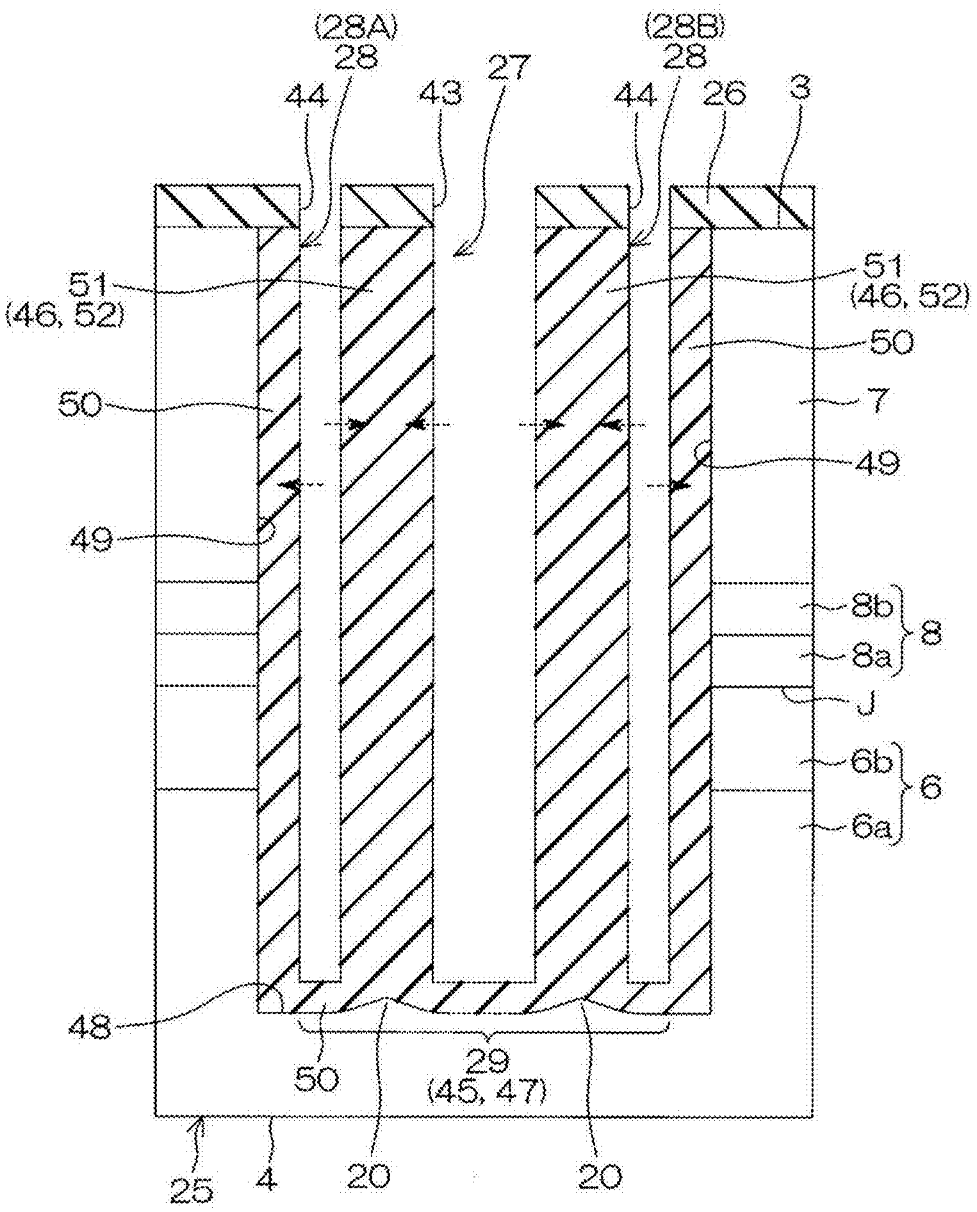
FIG. 9B is a diagram showing the next step of FIG. 8B.
Figure 10A:
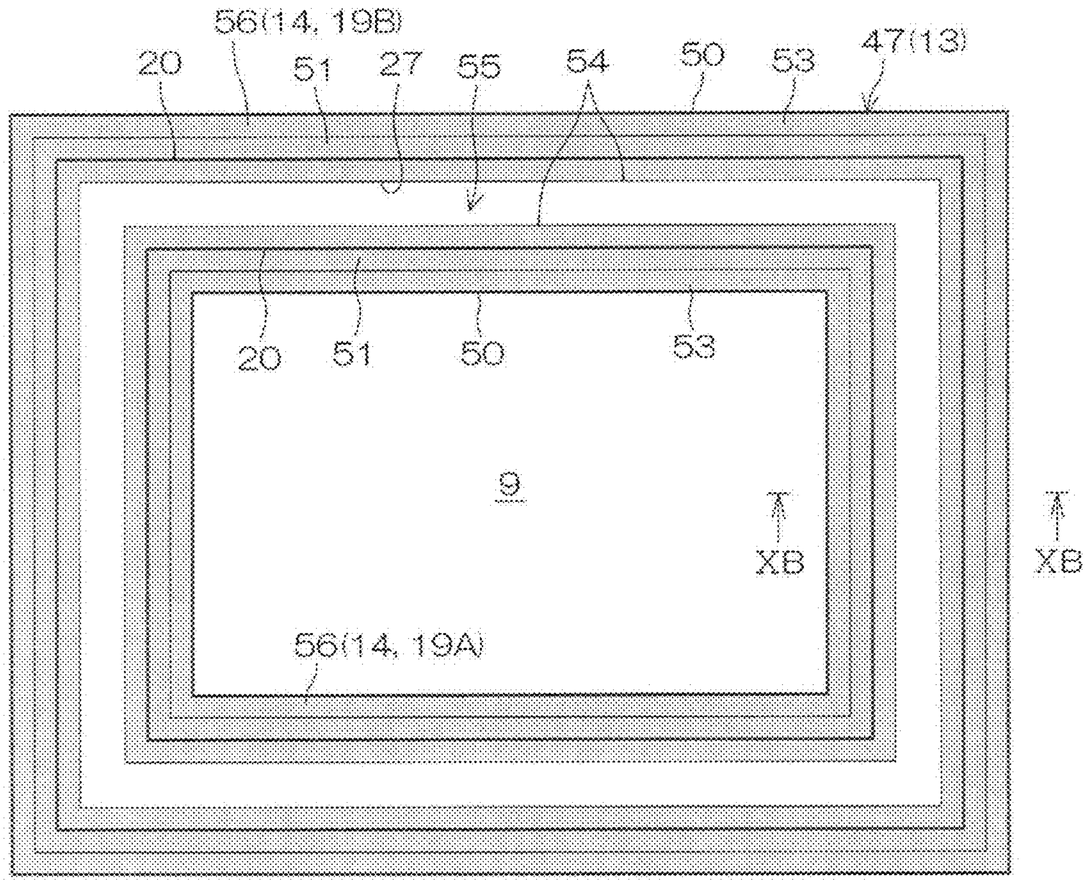
FIG. 10A is a diagram showing the next process of FIG. 9A.
Figure 10B:
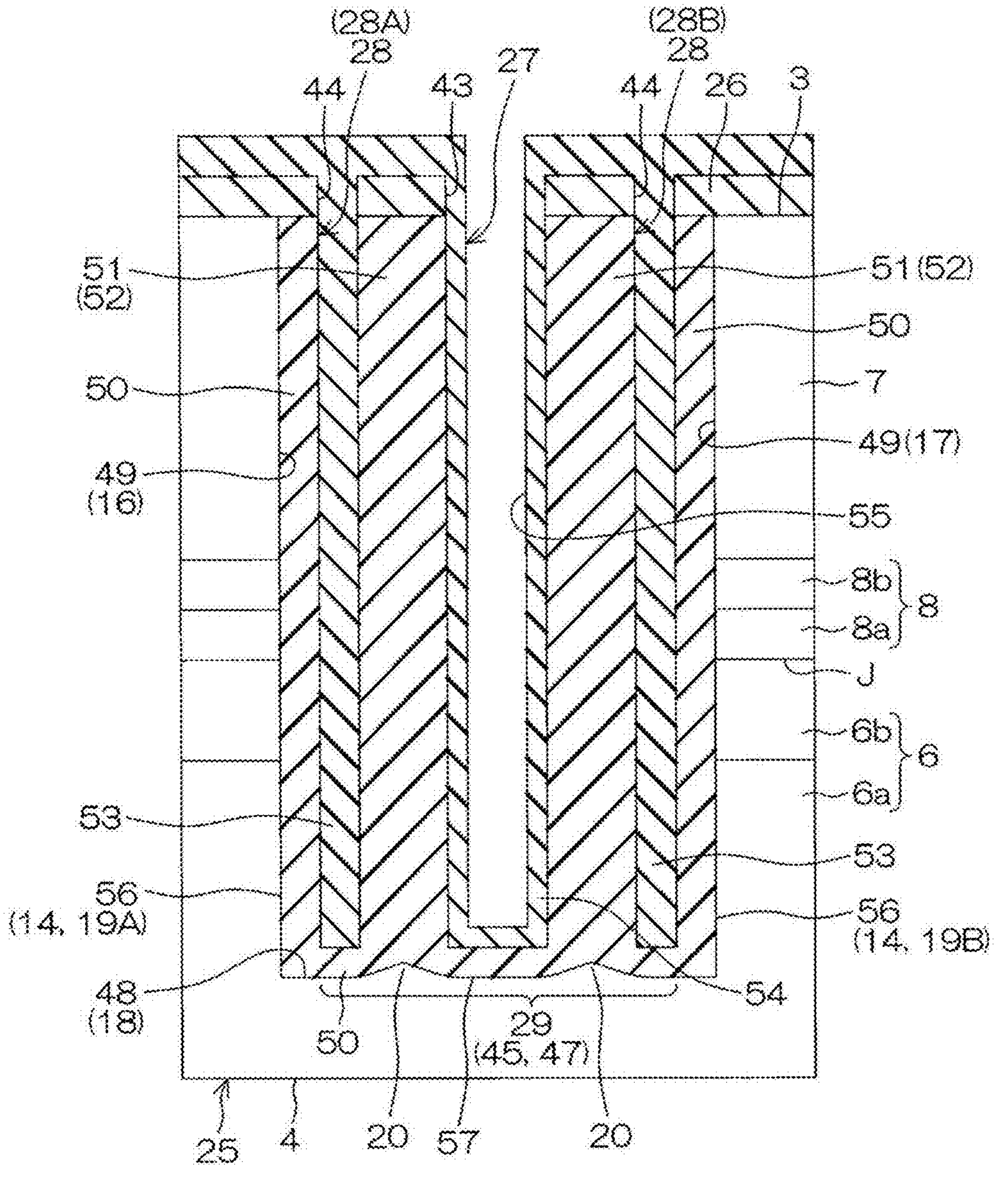
FIG. 10B is a diagram showing the next process of FIG. 9B.

Referring next to FIGS. 9A and 9B, the semiconductor wafer 25 is thermally oxidized. As a result, a first insulating film 50 is formed on the bottom wall 48 and the side wall 49 of the trench 47 (step S5). The first insulating film 50 may be referred to as a "thermal oxide film" or a "liner oxide film." In FIG. 9A, the first insulating film 50 is indicated by a relatively thick solid line. By this thermal oxidation, the semiconductor wall portion 46 is modified into an insulator by being oxidized from the side facing the main trench 27 and the side facing the sub-trenches 28, and is formed as an insulator wall portion 51. The insulator wall portion 51 may be referred to as a boundary insulating film 52 that forms a boundary between the adjacent deep trenches 29. Since the insulator wall portion 51 (boundary insulating film 52) is formed by modifying the semiconductor wall portion 46, it may have the same thickness T2 as the semiconductor wall portion 46.

Meanwhile, in this step, the lower portion of the semiconductor wall portion 46 in the depth direction of the trench 47 is not partially modified into an insulator such that a protrusion 20 protruding from the lower end of the insulator wall portion 51 toward the inner upper side of the insulator wall portion 51 is formed. Next, referring to FIGS. 10A and 10B, an insulating material is deposited on the semiconductor wafer 25 by, for example, a CVD method. The gas used in the CVD method may be, for example, a TEOS (Tetra Ethyl Ortho Silicate) gas. The insulating material backfills the sub-trenches 28 and deposits along the inner surface of the main trench 27. As a result, an embedded insulating film 53 embedded in the sub-trenches 28 is formed, and a second insulating film 54 extending along the inner surface of the main trench 27 is formed (step S6). In other words, the second insulating film 54 is formed on the side wall of the insulator wall portion 51 and the bottom wall 48 of the trench 47. A space 55 surrounded by the second insulating film 54 remains in the main trench 27.

As a result, a side wall insulating film 56 including a first insulating film 50, an embedded insulating film 53, an insulator wall portion 51 and a second insulating film 54, which are sequentially stacked from the side wall 49 in the direction intersecting the depth direction of the trench 47, and a bottom wall insulating film 57 including a first insulating film 50 and a second insulating film 54, which are sequentially stacked from the bottom wall 48 in the depth direction of the trench 47, are formed in the trench 47. In this state, the trench 47 corresponds to the above-mentioned trench 13, and the side wall insulating film 56 corresponds to the above-mentioned trench insulating film 14. Further, the side wall 49 of the trench 47 corresponds to the inner peripheral wall 16 and the outer peripheral wall 17 described above, and the bottom wall 48 of the trench 47 corresponds to the bottom wall 18 described above.

Figure 11A:
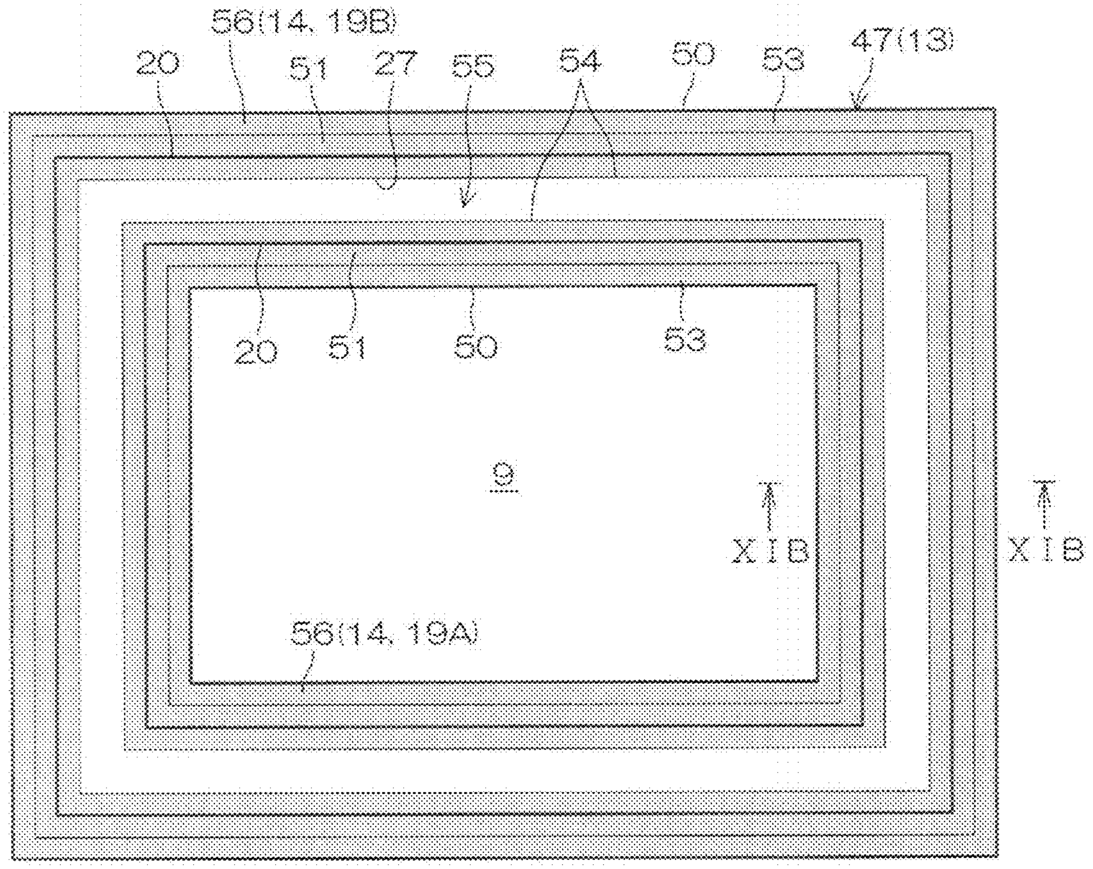
FIG. 11A is a diagram showing the next process of FIG. 10A.
Figure 11B:
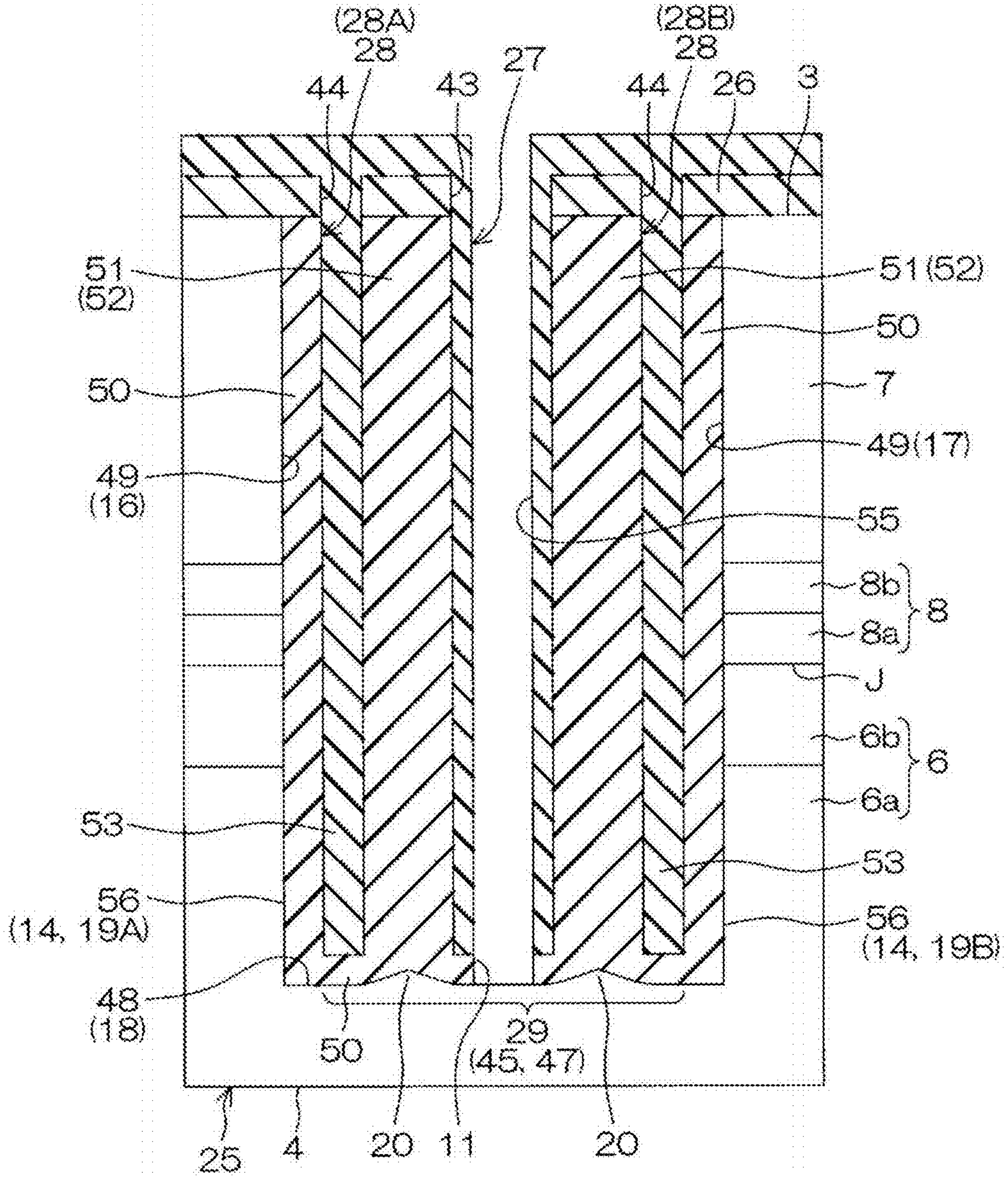
FIG. 11B is a diagram showing the next process of FIG. 10B.
Figure 12A:
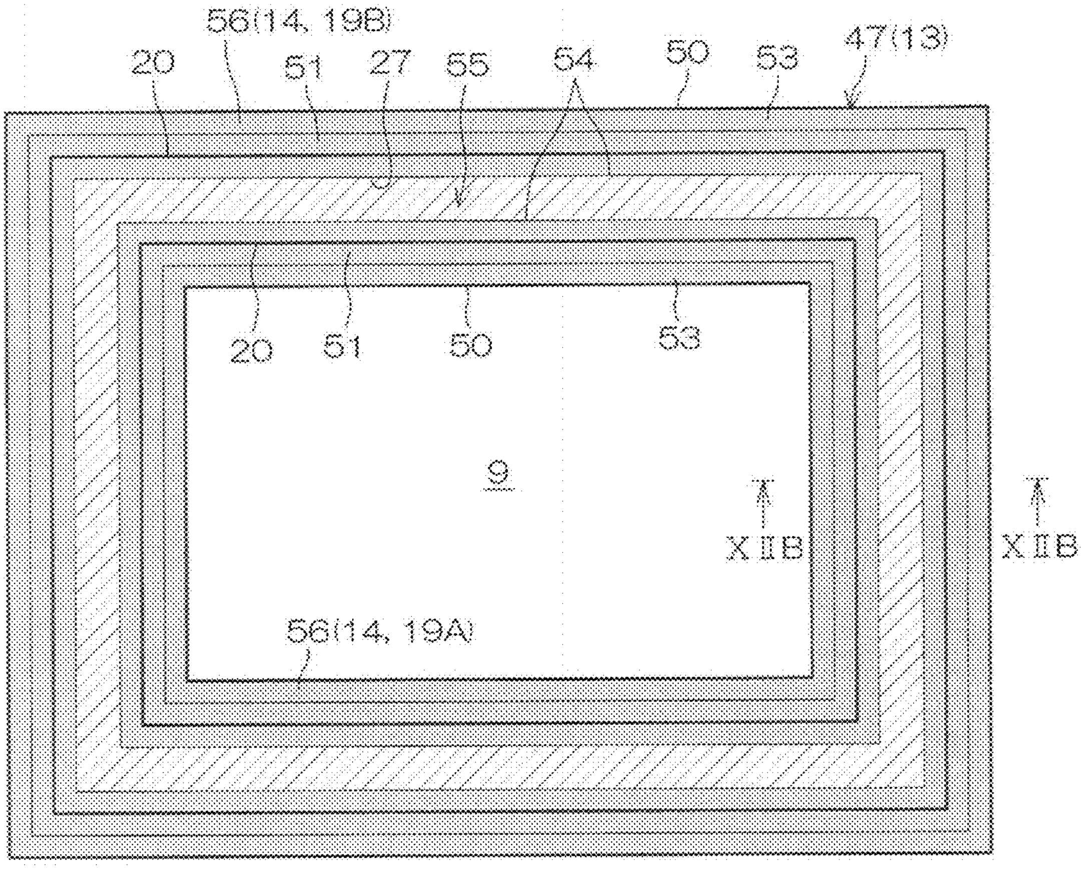
FIG. 12A is a diagram showing the next step of FIG. 11A.
Figure 12B:
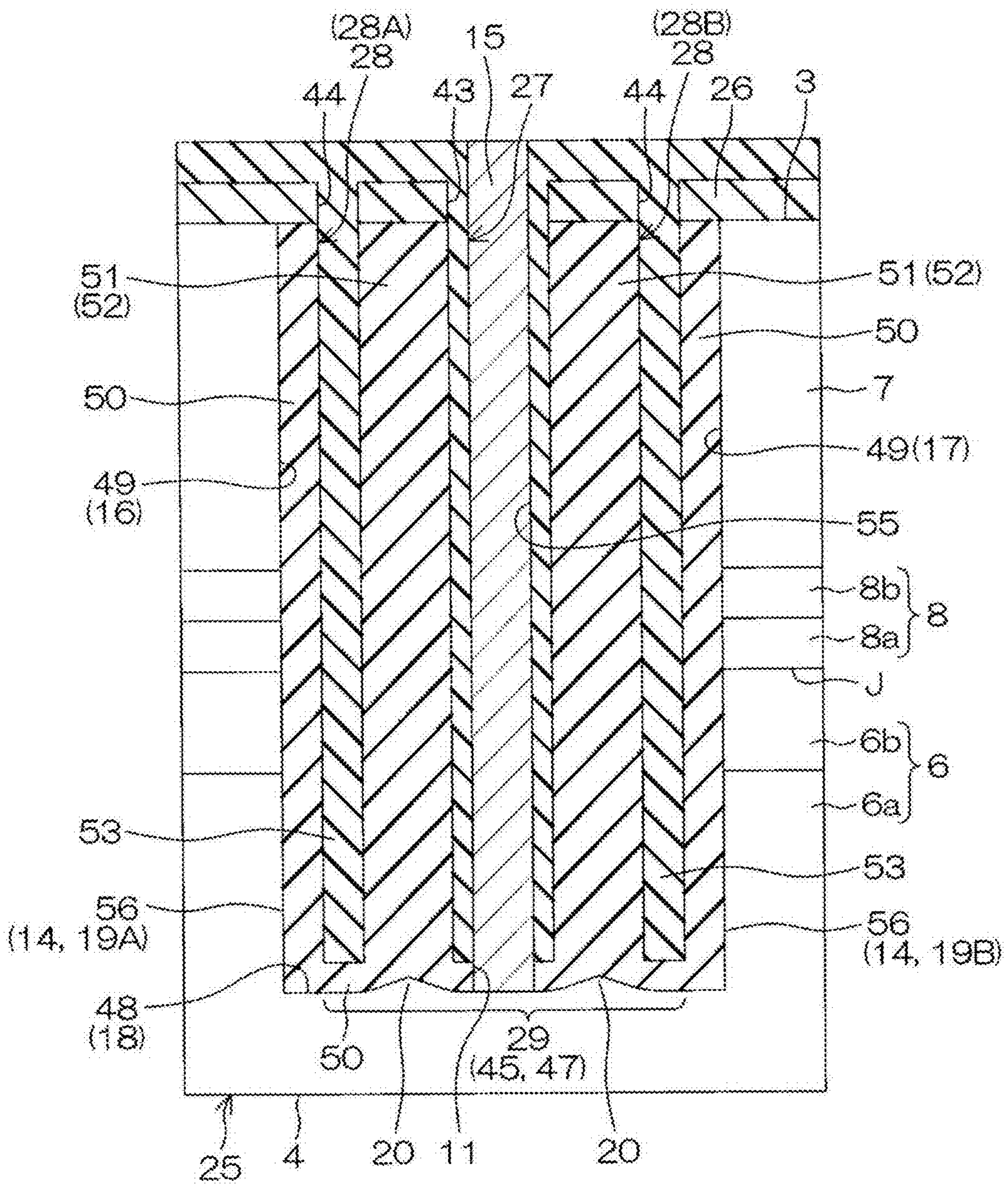
FIG. 12B is a diagram showing the next step of FIG. 11B.

Referring next to FIGS. 11A and 11B, the bottom wall insulating film 57 exposed in the space 55 of the main trench 27 is selectively removed by etching. As a result, a contact hole 11 that exposes a part of the semiconductor wafer 25 from the bottom wall 18 is formed (step S7). Referring next to FIGS. 12A and 12B, a conductive material is deposited on the semiconductor wafer 25 by, for example, a CVD method. The conductive material is polysilicon in this embodiment. The conductive material backfills the space 55 of the main trench 27. As a result, a trench electrode 15 is formed in the main trench 27 (step S8). The trench electrode 15 is connected to the semiconductor wafer 25 via the contact hole 11. Thereafter, the hard mask 26 and the second insulating film 54 on the first main surface 3 of the semiconductor wafer 25 are removed. Through the above steps, the element isolation structure 10 is formed.

The next step is a step of forming a MISFET 30 in the element region 9. For example, a first well region 31 and a second well region 32 are formed in the element region 9 (step S9), and a shallow trench structure 37 is formed (step S10). Thereafter, element structures such as a drain region 33 and a source region 34 are formed (step S11), and a planar gate structure 38 is formed. Then, the semiconductor wafer 25 is divided into individual semiconductor chips 2. Then, if necessary, the semiconductor chip 2 is bonded to a lead frame and sealed with a sealing resin to obtain a semiconductor device 1.

According to the above-described method, the boundary insulating film 52 (insulator wall portion 51) forming a part of the side wall insulating film 56 of the trench 13 is obtained by modifying the semiconductor wall portion 46 sandwiched between the adjacent annular deep trenches 29. Therefore, by increasing the number of sub-trenches 28 and increasing the number of semiconductor wall portions 46, the side wall insulating film 56 can be selectively thickened among the side wall insulating film 56 and the bottom wall insulating film 57 in the trench group 45. Therefore, it is possible to prevent the bottom wall insulating film 57 from being thickened as the side wall insulating film 56 is thickened. As a result, the bottom wall insulating film 57 can be maintained thinner than the side wall insulating film 56. Therefore, the time required to form the contact hole 11 in the bottom wall insulating film 57 in the steps of FIGS. 11A and 11B can be shortened. Accordingly, it is possible to improve the manufacturing efficiency of the semiconductor device 1. Further, the thickness of the side wall insulating film 56 can be controlled according to the increased number of the sub-trenches 28 and thus, a desired withstand voltage can be easily achieved. As a result, it is possible to achieve both improvement in manufacturing efficiency and improvement in withstand voltage.

Figure 13A:
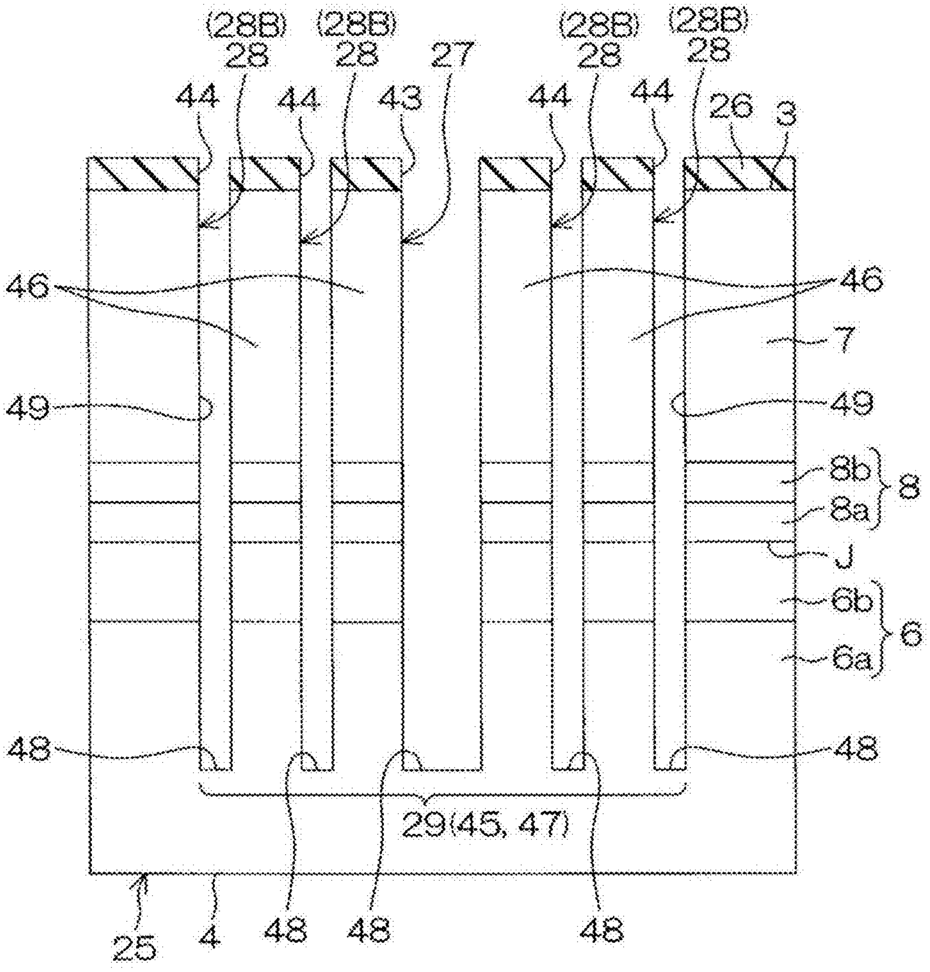
FIG. 13A is a diagram showing a modification of the semiconductor device manufacturing process.
Figure 13B:
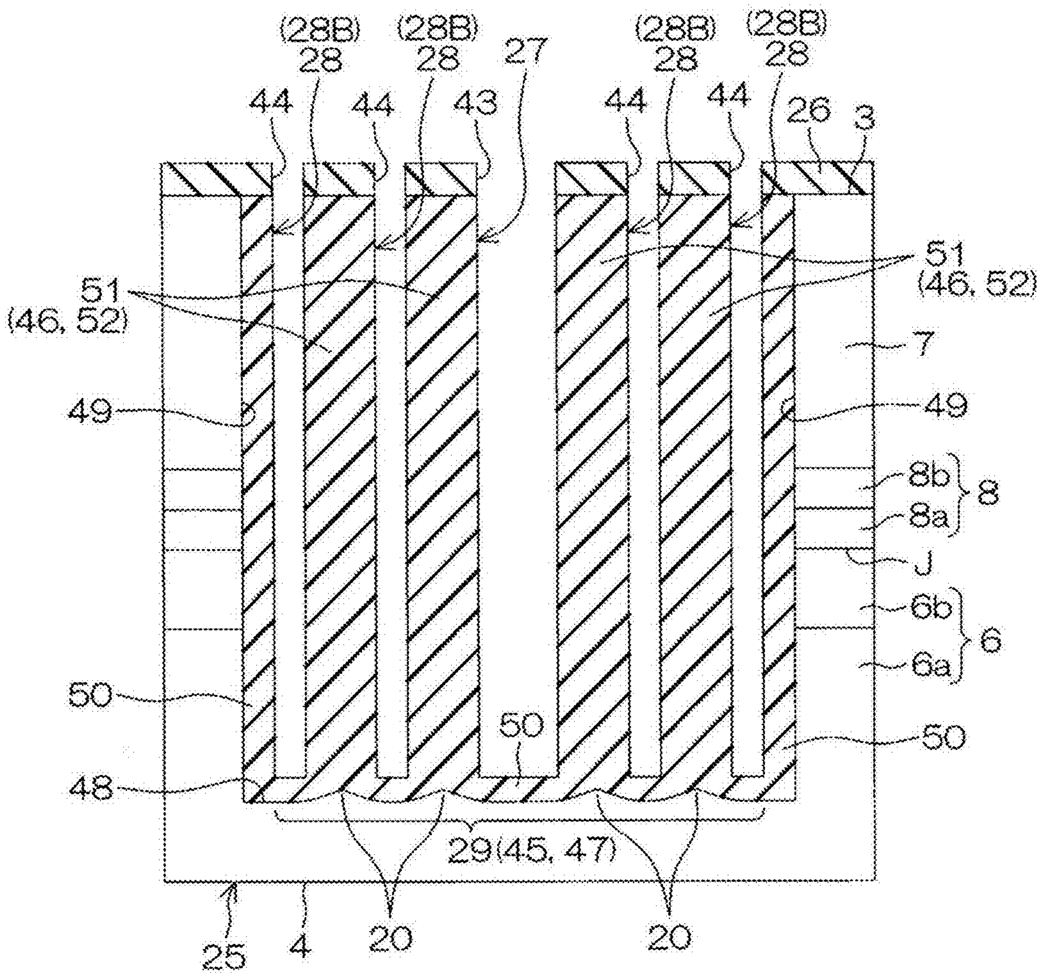
FIG. 13B is a diagram showing the next step of FIG. 13A.

Further, the four corners of the trench 47 have a round shape in a plan view. Therefore, the width of the trench 47 can be made uniform over the entire circumference. As a result, the embedded insulating film 53 can be evenly embedded in the steps of FIGS. 10A and 10B. In the steps of FIGS. 8A, 8B to 12A, and 12B, one sub-trench 28 is formed on each of the side (inside) of the element region 9 and the opposite side (outside) of the element region 9 with regard to the main trench 27. However, as shown in FIG. 13A, a plurality of sub-trenches 28 may be formed on each side. As a result, a plurality of semiconductor wall portions 46 are formed on both the inner and outer sides of the main trench 27. Therefore, as shown in FIG. 13B, a plurality of insulator wall portions 51 (boundary insulating film 52) can be formed by thermally oxidizing the plurality of semiconductor wall portions 46 on each side. As a result, it is possible to form a side wall insulating film 56 thicker than the side wall insulating film 56 formed in the steps of FIGS. 8A, 8B to 12A, and 12B.

Figure 14:
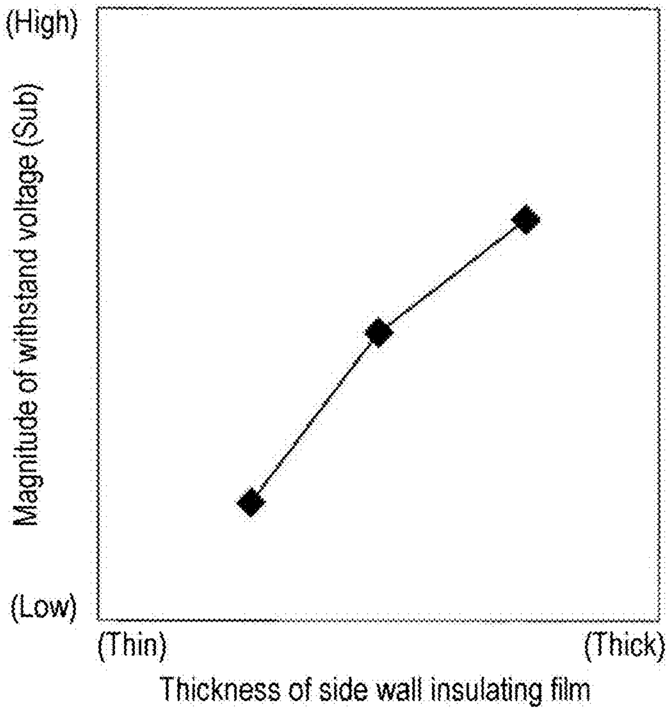
FIG. 14 is a diagram showing a relationship between a thickness of a side wall insulating film of an element isolation structure and a magnitude of a withstand voltage.

FIG. 14 is a diagram showing a relationship between the thickness of the side wall insulating film 19 of the element isolation structure 10 and the magnitude of the withstand voltage. The horizontal axis in FIG. 14 indicates the thickness of the side wall insulating film 19. It is indicated that the side wall insulating film 19 is thicker on the right side on the horizontal axis. The vertical axis in FIG. 14 indicates the magnitude of a breakdown voltage (BV Sub) of a substrate when a reverse voltage is applied to between a source and a drain. It is indicated that the breakdown voltage and the withstand voltage are higher on the upper side on the vertical axis. As a result of verifying FIG. 14, the thicker the side wall insulating film 19, the higher the withstand voltage. Therefore, by forming the side wall insulating film 19 thick according to the above-mentioned method, it is possible to enhance the withstand voltage of the semiconductor device 1 while suppressing a decrease in manufacturing efficiency.

Although the embodiment of the present disclosure has been described above, the present disclosure may also be implemented in other embodiments. For example, in the above-described embodiment, there has been described the example in which the first conduction type is p type and the second conduction type is n type. However, the first conduction type may be n type and the second conduction type may be p type. The specific configuration in this case can be obtained by replacing the n-type region with a p-type region and replacing the p-type region with a n-type region in the above description and the accompanying drawings. In the above-described embodiment, there has been described the example in which the p-type is expressed as “first conduction type” and the n-type is expressed as “second conduction type.” However, these are used for the purpose of clarifying the order of explanation. The p-type may be expressed as “second conduction type” and the n-type may be expressed as “first conduction type.”

The embodiments of the present disclosure are exemplary in all respects and should not be construed in a limited manner. They are intended to include modifications in all respects. The features described below may be extracted from the description in the subject specification and the drawings.

Supplementary Note 1-1

A semiconductor device (1), comprising:

a semiconductor chip (2) including a first main surface (3) on one side and a second main surface (4) on the other side;

a pn junction portion (J) extending along the first main surface (3) and formed inside the semiconductor chip (2);

a trench (13) configured to penetrate the pn junction portion (J) from the first main surface (3) and partition an element region (9 or 9A) in the semiconductor chip (2);

an insulating film (14) configured to cover a side wall (16 or 17) and a bottom wall (18) of the trench (13); and an embedded electrode (15) embedded in the trench (13) via the insulating film (14), wherein the bottom wall (18) of the trench (13) includes a protrusion (20) protruding from a lower end of the insulating film (14) toward an inner upper side of the insulating film (14) in a depth direction of the trench (13).

Supplementary Note 1-2

The semiconductor device (1) of Supplementary Note 1-1, wherein the insulating film (14) includes a contact hole (11) that selectively exposes the bottom wall (18) of the trench (13), and wherein the embedded electrode (15) includes a contact portion (12) connected to the semiconductor chip (2) via the contact hole (11).

Supplementary Note 1-3

The semiconductor device (1) of Supplementary Note 1-2, wherein the semiconductor chip (2) includes a recess (21) continuous with the contact hole (11), and wherein the contact portion (12) is formed in the recess (21) via the contact hole (11).

Supplementary Note 1-4

The semiconductor device (1) of Supplementary Note 1-3, wherein the contact portion (12) includes a bottom portion (121) extending along the bottom wall (18) of the trench (13), and a side portion (122) extending upward from the bottom portion (121) and crossing a boundary portion (24) between the insulating film (14) and the bottom wall (18) of the trench (13).

Supplementary Note 1-5

The semiconductor device (1) of Supplementary Note 1-4, wherein the side portion (122) of the contact portion (12) has a curved shape in a cross-sectional view.

Supplementary Note 1-6

The semiconductor device (1) of any one of Supplementary Notes 1-1 to 1-5, wherein the thickness (T1) of the insulating film (14) in a direction intersecting the depth direction of the trench (13) is 2 μm or more and 6 μm or less.

According to this configuration, the thickness of the insulating film (14) is 2 μm or more and 6 μm or less. Therefore, the withstand voltage can be kept relatively high.

Supplementary Note 1-7

The semiconductor device (1) of any one of Supplementary Notes 1-1 to 1-6, wherein the insulating film (14) includes a first film portion (141) having a relatively high density and a second film portion (142) having a lower density than the first film portion (141), and wherein the second film portion (142), the first film portion (141), the second film portion (142), and the first film portion (141), each of which extends in the depth direction of the trench (13), are formed sequentially from the embedded electrode (15) toward the side wall (16 or 17) of the trench (13) in a direction intersecting the depth direction of the trench (13).

Supplementary Note 1-8

The semiconductor device (1) of Supplementary Note 1-7, wherein at least the side wall (16 or 17) and the bottom wall (18) of the trench (13) are covered with the first film portion (141) of the insulating film (14).

Supplementary Note 1-9

The semiconductor device (1) of Supplementary Note 1-8, wherein the protrusion (20) is formed to protrude into an interior of the first film portion (141) that covers the bottom wall (18) of the trench (13).

Supplementary Note 1-10

The semiconductor device (1) of any one of Supplementary Notes 1-1 to 1-9, wherein the trench (13) includes an annular trench (13) that surrounds the element region (9 or 9A),

- wherein the insulating film (14) includes an annular portion formed on a side wall (16 or 17) of the annular trench (13) along a circumferential direction of the annular trench (13) in a plan view, and
- wherein the protrusion (20) is formed to overlap with the annular portion, along the circumferential direction of the annular portion of the insulating film (14) in a plan view.

Supplementary Note 1-11

A method of manufacturing a semiconductor device (1), comprising:

- a first step of forming a trench (47) penetrating the pn junction portion (J) and partitioning an element region (9 or 9A) in a semiconductor layer (25) by selectively etching the semiconductor layer (25), which includes a first main surface (3) on one side and a second main surface (4) on the other side and in which the pn junction portion (J) extending along the first main surface (3) is formed, and forming a semiconductor wall portion (46) erected on a bottom wall (48) of the trench (47) by using a part of the semiconductor layer (25) and facing a side wall (49) of the trench (47) across a space (28);
- a second step of forming a first insulating film (50) along the side wall (49) and the bottom wall (48) of the trench (47) by thermal oxidation, modifying the semiconductor wall portion (46) into an insulator by the thermal oxidation, forming an insulator wall portion (51) facing the first insulating film (50) on the side wall (49) of the trench (47) across the space (28);
- a third step of forming a side wall insulating film (56) including the first insulating film (50), the embedded insulating film (53), the insulator wall portion (51) and the second insulating film (54) on the side wall (49) of the trench (47) and a bottom wall insulating film (57) including the first insulating film (50) and the second insulating film (54) on the bottom wall (48) of the trench (47), by depositing an insulating material in the trench (47) to form the embedded insulating film (53) back-filling the space (28) and the second insulating film (54) extending along the side wall of the insulator wall portion (51) and the bottom wall (48) of the trench (47) on the opposite side of the space (28); and
- a fourth step of forming an embedded electrode (15) back-filling the trench (47) by depositing a conductive material in the trench (47).

According to this method, the insulator wall portion (51) (the semiconductor wall portion (46)) forming a part of the side wall insulating film (56) is erected on the bottom wall (48) of the trench (47) so as to extend along the side wall (49) of the trench (47). Therefore, by increasing the number of the semiconductor wall portions (46), the side wall insulating film (56) can be selectively thickened among the side wall insulating film (56) and the bottom wall insulating film (57) in the trench (47). Therefore, it is possible to prevent the bottom wall insulating film (57) from being thickened along with the thickening of the side wall insulating film (56). As a result, the bottom wall insulating film (57) can be kept thinner than the side wall insulating film (56) to shorten the time required for the etching process of the bottom wall insulating film (57). Accordingly, it is possible to improve the manufacturing efficiency of the semiconductor device (1). Further, since the thickness of the side wall insulating film (56) can be controlled according to the increased number of the semiconductor wall portions (46), a desired withstand voltage can be easily achieved. As a result, it is possible to achieve both the improvement in manufacturing efficiency and the improvement in withstand voltage.

Supplementary Note 1-12

The method of Supplementary Note 1-11, wherein the second step includes partially not modifying a lower portion of the semiconductor wall portion (46) in the depth direction of the trench (47) into the insulator such that a protrusion (20) protruding from a lower end of the insulator wall portion (51) toward an inner upper side of the insulator wall portion (51) is formed.

Supplementary Note 1-13

The method of Supplementary Note 1-11 or 1-12, wherein the thickness (T2) of the semiconductor wall portion (46) is 1 μm or less.

According to this method, the semiconductor wall portion (46) can be easily modified into the insulator wall portion (51) by thermal oxidation.

Supplementary Note 1-14

A method of manufacturing a semiconductor device (1), comprising:

a first step of forming a trench group (45) including at least three annular trenches (29) arranged concentrically with each other, penetrating the pn junction portion (J) and partitioning an element region (9 or 9A) in the semiconductor layer (25) by selectively etching the semiconductor layer (25), which includes a first main surface (3) on one side and a second main surface (4) on the other side and in which the pn junction portion (J) extending along the first main surface (3) is formed, wherein the trench group (45) includes a main trench (27) and a plurality of sub-trenches (28) arranged inside and outside the main trench (27) and having a smaller width than the main trench (27);

a second step of forming a first insulating film (50) along a side wall and a bottom wall (48) of each of the annular trenches (29) belonging to the trench group (45) by thermal oxidation, modifying a portion (46) of the semiconductor layer (25) sandwiched between the annular trenches (29) adjacent each other into an insulator by the thermal oxidation, and forming a boundary insulating film (52) forming a boundary between the annular trenches (29) adjacent each other;

a third step of forming a side wall insulating film (56) including the second insulating film (54), the boundary insulating film (52), the embedded insulating film (53) and the first insulating film (50) on each of the inside and outside of the main trench (27) and forming a bottom wall insulating film (57) including the first insulating film (50) and the second insulating film (54) on the bottom wall (48) of the main trench (27), by depositing an insulating material in the trench group (45) after the second step to form the embedded insulating film (53) back-filling the sub-trenches (28) and the second insulating film (54) extending along an inner surface of the main trench (27);

a fourth step of forming a contact hole (11) exposing a part of the semiconductor layer (25) in the bottom wall (48) of the main trench (27) by selectively removing the bottom wall insulating film (57) in the main trench (27); and a fifth step of forming an embedded electrode (15) back-filling the main trench (27) and connected to the semiconductor layer (25) via the contact hole (11) by depositing a conductive material in the main trench (27).

According to this method, the boundary insulating film (52) forming a part of the side wall insulating film (56) is obtained by modifying a portion of the semiconductor layer (25) sandwiched between the adjacent annular trenches (29). Therefore, by increasing the number of the sub-trenches (28), the side wall insulating film (56) can be selectively thickened among the side wall insulating film (56) and the bottom wall insulating film (57) in the trench group (45). Therefore, it is possible to prevent the bottom wall insulating film (57) from being thickened along with the thickening of the side wall insulating film (56). As a result, the bottom wall insulating film (57) can be kept thinner than the side wall insulating film (56) to shorten the time required for forming the contact hole (11) in the bottom wall insulating film (57) in the fourth step. Accordingly, it is possible to improve the manufacturing efficiency of the semiconductor device (1). Further, since the thickness of the side wall insulating film (56) can be controlled according to the increased number of the sub-trenches (28), a desired withstand voltage can be easily achieved. As a result, it is possible to achieve both the improvement in manufacturing efficiency and the improvement in withstand voltage.

Supplementary Note 1-15

The method of Supplementary Note 1-14, wherein the second step includes partially not modifying a lower portion of the semiconductor layer (25) sandwiched between the annular trenches (29) adjacent each other in the depth direction of the trench group (45) into the insulator such that a protrusion (20) protruding from a lower end of the boundary insulating film (52) toward an inner upper side of the boundary insulating film (52) is formed.

Supplementary Note 1-16

The method of Supplementary Note 1-14 or 1-15, wherein the first step includes forming the same number of the sub-trenches (28) inside and outside of the main trench (27).

According to this method, the side wall insulating films (56) having a thickness equal to each other can be formed inside and outside the main trench (27).

Supplementary Note 1-17

The method of any one of Supplementary Notes 1-14 to 1-16, wherein the first step includes forming a plurality of the sub-trenches (28) on each of the inside and outside of the main trench (27), respectively.

Supplementary Note 1-18

The method of any one of Supplementary Notes 1-14 to 1-17, wherein the width (W2) of the main trench (28) is 2.5 μm or more and 3 μm or less, and the width (W3) of the sub-trenches (28) is 1 μm or more and 1.5 μm or less.

Supplementary Note 1-19

The method of any one of Supplementary Notes 1-14 to 1-18, wherein the thickness (T2) of the boundary insulating film (52) in a direction intersecting the depth direction of the trench group (45) is 1 μm or less.

Supplementary Note 1-20

The method of any one of Supplementary Notes 1-11 to 1-19, wherein the third step includes depositing the insulating material by a CVD method using a TEOS gas.

According to the present disclosure in some embodiments, it is possible to a semiconductor device capable of achieving both the improvement of manufacturing efficiency and the improvement of a withstand voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
a semiconductor chip including a first main surface on one side and a second main surface on the other side;
a pn junction portion extending along the first main surface and formed inside the semiconductor chip;
a trench configured to penetrate the pn junction portion from the first main surface and partition an element region in the semiconductor chip;
an insulating film configured to cover a side wall and a bottom wall of the trench; and
an embedded electrode embedded in the trench via the insulating film,
wherein the bottom wall of the trench includes a protrusion protruding from a lower end of the insulating film toward an inner upper side of the insulating film in a depth direction of the trench, and
wherein a thickness of the insulating film in a direction intersecting the depth direction of the trench is 2 μm or more and 6 μm or less.

2. The semiconductor device of claim 1, wherein the insulating film includes a contact hole that selectively exposes the bottom wall of the trench, and
wherein the embedded electrode includes a contact portion connected to the semiconductor chip via the contact hole.

3. The semiconductor device of claim 2, wherein the semiconductor chip includes a recess continuous with the contact hole, and
wherein the contact portion is formed in the recess via the contact hole.

4. The semiconductor device of claim 3, wherein the contact portion includes a bottom portion extending along the bottom wall of the trench, and a side portion extending upward from the bottom portion and crossing a boundary portion between the insulating film and the bottom wall of the trench.

5. The semiconductor device of claim 4, wherein the side portion of the contact portion has a curved shape in a cross-sectional view.

6. The semiconductor device of claim 1, wherein the direction intersecting the depth direction of the trench is orthogonal to the depth direction of the trench.

7. The semiconductor device of claim 1,
wherein the insulating film is formed of:
a first film portion including a first portion and a second portion, and
a second film portion including a third portion and a fourth portion, and having a lower density than the first film portion; and
wherein the third portion, the first portion, the fourth portion and the second portion, each of which extends in the depth direction of the trench, are formed sequentially from the embedded electrode toward the side wall of the trench in the direction intersecting the depth direction of the trench.

8. The semiconductor device of claim 7, wherein at least the side wall and the bottom wall of the trench are covered with the first film portion of the insulating film.

9. The semiconductor device of claim 8, wherein the protrusion is formed to protrude into an interior of the first film portion that covers the bottom wall of the trench.

10. The semiconductor device of claim 1, wherein the trench includes an annular trench that surrounds the element region,
wherein the insulating film includes an annular portion formed on a side wall of the annular trench along a circumferential direction of the annular trench in a plan view, and
wherein the protrusion is formed to overlap with the annular portion, along the circumferential direction of the annular portion of the insulating film in a plan view.

11. A method of manufacturing a semiconductor device, comprising:
a first step of forming a trench penetrating a pn junction portion and partitioning an element region in a semiconductor layer by selectively etching the semiconductor layer, which includes a first main surface on one side and a second main surface on the other side and in which the pn junction portion extending along the first main surface is formed, and forming a semiconductor wall portion erected on a bottom wall of the trench by using a part of the semiconductor layer and facing a side wall of the trench across a space;
a second step of forming a first insulating film along the side wall and the bottom wall of the trench by thermal oxidation, modifying the semiconductor wall portion into an insulator by the thermal oxidation, and forming an insulator wall portion facing the first insulating film on the side wall of the trench across the space;
a third step of forming a side wall insulating film including the first insulating film, an embedded insulating film, the insulator wall portion and a second insulating film on the side wall of the trench, and a bottom wall insulating film including the first insulating film and the second insulating film on the bottom wall of the trench, by depositing an insulating material in the trench to form the embedded insulating film back-filling the space and the second insulating film extending along the side wall of the insulator wall portion and the bottom wall of the trench on the opposite side of the space; and
a fourth step of forming an embedded electrode back-filling the trench by depositing a conductive material in the trench,
wherein a thickness of the side wall insulating film in a direction intersecting a depth direction of the trench is 2 μm or more and 6 μm or less.

12. The method of claim 11, wherein the third step includes depositing the insulating material by a CVD method using a TEOS gas.

13. The method of claim 11, wherein a thickness of the semiconductor wall portion is 1 μm or less.

14. A method of manufacturing a semiconductor device, comprising:
a first step of forming a trench group including at least three annular trenches arranged concentrically with each other, penetrating a pn junction portion and partitioning an element region in a semiconductor layer by selectively etching the semiconductor layer, which includes a first main surface one side and a second main surface on the other side and in which the pn junction portion extending along the first main surface is formed, wherein the trench group includes a main trench and a plurality of sub-trenches arranged inside and outside the main trench and having a smaller width than the main trench;
a second step of forming a first insulating film along a side wall and a bottom wall of each of the annular trenches belonging to the trench group by thermal oxidation, modifying a portion of the semiconductor layer sandwiched between the annular trenches adjacent each other into an insulator by the thermal oxidation, and forming a boundary insulating film forming a boundary between the annular trenches adjacent each other;

a third step of forming a side wall insulating film including a second insulating film, the boundary insulating film, an embedded insulating film and the first insulating film on each of the inside and outside of the main trench and a furth including the first insulating film and the second insulating film on the bottom wall of the main trench, by depositing an insulating material in the trench group after the second step to form the embedded insulating film back-filling the sub-trenches and the second insulating film extending along an inner surface of the main trench;

a fourth step of forming a contact hole exposing a part of the semiconductor layer in the bottom wall of the main trench by selectively removing the bottom wall insulating film in the main trench; and a fifth step of forming an embedded electrode back-filling the main trench and connected to the semiconductor layer via the contact hole by depositing a conductive material in the main trench, wherein a thickness of the side wall insulating film in a direction intersecting a depth direction of the trench group is 2 μm or more and 6 μm or less.

15. The method of claim 14, wherein a thickness of the boundary insulating film in the direction intersecting the depth direction of the trench group is 1 μm or less.

16. The method of claim 14, wherein the first step includes forming the same number of the sub-trenches inside and outside of the main trench.

17. The method of claim 14, wherein the first step includes forming a plurality of the sub-trenches on each of the inside and outside of the main trench, respectively.

18. The method of claim 14, wherein a width of the main trench is 2.5 μm or more and 3 μm or less, and a width of the sub-trenches is 1 μm or more and 1.5 μm or less.

* * * * *